(12) United States Patent
Karnezos

(10) Patent No.: US 8,970,049 B2
(45) Date of Patent: Mar. 3, 2015

(54) MULTIPLE CHIP PACKAGE MODULE HAVING INVERTED PACKAGE STACKED OVER DIE

(75) Inventor: Marcos Karnezos, Palo Alto, CA (US)

(73) Assignee: ChipPAC, Inc., Fremont, CA (US)

( * ) Notice: Subject to any disclaimer, the term of this patent is extended or adjusted under 35 U.S.C. 154(b) by 434 days.

(21) Appl. No.: 11/014,257

(22) Filed: Dec. 16, 2004

(65) Prior Publication Data

US 2005/0133916 A1    Jun. 23, 2005

Related U.S. Application Data

(60) Provisional application No. 60/530,423, filed on Dec. 17, 2003.

(51) Int. Cl.
*H01L 21/02* (2006.01)
*H01L 23/28* (2006.01)
(Continued)

(52) U.S. Cl.
CPC ............ *H01L 25/03* (2013.01); *H01L 23/4334* (2013.01); *H01L 25/0657* (2013.01); *H01L 2224/48225* (2013.01); *H01L 2224/73215* (2013.01); *H01L 2225/0651* (2013.01); *H01L 2225/06575* (2013.01); *H01L 2225/06582* (2013.01); *H01L 2924/01079* (2013.01); *H01L 2924/15311* (2013.01); *H01L 2924/19107* (2013.01); *H01L 2924/30107* (2013.01); *H01L 2924/3025* (2013.01); *H01L 24/48* (2013.01); *H01L 2224/32225* (2013.01); *H01L 2224/48227* (2013.01); *H01L 2224/49175* (2013.01); *H01L 2224/73265* (2013.01);

(Continued)

(58) Field of Classification Search
USPC ......... 257/686, 738, 777, 668, 676, 723, 784, 257/E23.013; 438/112
See application file for complete search history.

(56) References Cited

U.S. PATENT DOCUMENTS 5,222,014 A    6/1993    Lin
5,229,960 A    7/1993    De Givry
(Continued)

FOREIGN PATENT DOCUMENTS

JP    05-160170 A    6/1993
JP    05152505 A    6/1993
(Continued)

OTHER PUBLICATIONS

Office Action for International Application No. 2006-545467.

*Primary Examiner* — Zandra Smith
*Assistant Examiner* — Tsz Chiu
(74) *Attorney, Agent, or Firm* — Ishimaru & Associates LLP

(57) ABSTRACT

A module having multiple die includes a first die on a first substrate and an inverted second package stacked over the first die, with, where necessary, provision is made for a standoff between the second package and the first die. Also, methods for making the module include steps of providing a first package having a first die attached onto an upward facing side of a first package substrate, and stacking an inverted second package over the die on the first package, provision being made where necessary for a standoff between the second package and the first package die to avoid damaging impact between the downward-facing side of the second package and wire bonds connecting the first die to the first package substrate.

49 Claims, 10 Drawing Sheets

(51) Int. Cl.
*H01L 21/70* (2006.01)
*H01L 25/03* (2006.01)
*H01L 23/433* (2006.01)
*H01L 25/065* (2006.01)
*H01L 23/00* (2006.01)

(52) U.S. Cl.
CPC ............... *H01L 2224/16225* (2013.01); *H01L 2224/48465* (2013.01); *H01L 2224/73204* (2013.01); *H01L 2225/1023* (2013.01); *H01L 2225/1052* (2013.01); *H01L 2225/1058* (2013.01); *H01L 2924/10253* (2013.01)
USPC ............ 257/777; 257/783; 257/686; 257/782; 257/E21.505; 257/E21.705

(56) References Cited

U.S. PATENT DOCUMENTS

| | | | |
|---|---|---|---|
| 5,340,771 A | 8/1994 | Rostoker | |
| 5,373,189 A | 12/1994 | Massit et al. | |
| 5,436,203 A | 7/1995 | Lin | |
| 5,444,296 A | 8/1995 | Kaul et al. | |
| 5,495,398 A | 2/1996 | Takiar et al. | |
| 5,550,711 A | 8/1996 | Burns et al. | |
| 5,652,185 A | 7/1997 | Lee | |
| 5,675,180 A * | 10/1997 | Pedersen et al. | 257/685 |
| 5,677,247 A * | 10/1997 | Hundt et al. | 438/107 |
| 5,744,863 A | 4/1998 | Culnane et al. | |
| 5,898,219 A | 4/1999 | Barrow | |
| 5,899,705 A | 5/1999 | Akram | |
| 5,903,049 A | 5/1999 | Mori | |
| 5,977,640 A | 11/1999 | Bertin et al. | |
| 5,982,633 A | 11/1999 | Jeansonne | |
| 5,994,166 A | 11/1999 | Akram et al. | |
| 6,025,648 A | 2/2000 | Takahashi et al. | |
| 6,034,875 A | 3/2000 | Heim et al. | |
| 6,075,289 A | 6/2000 | Distefano | |
| 6,118,176 A | 9/2000 | Tao et al. | |
| 6,133,626 A | 10/2000 | Hawke et al. | |
| 6,157,080 A | 12/2000 | Tamaki et al. | |
| 6,168,973 B1 * | 1/2001 | Hubbard | 438/109 |
| 6,201,266 B1 | 3/2001 | Ohuchi et al. | |
| 6,201,302 B1 | 3/2001 | Tzu | |
| 6,238,949 B1 | 5/2001 | Nguyen et al. | |
| 6,265,766 B1 | 7/2001 | Moden | |
| 6,274,930 B1 | 8/2001 | Vaiyapuri et al. | |
| 6,316,838 B1 | 11/2001 | Ozawa et al. | |
| 6,333,552 B1 | 12/2001 | Kakimoto et al. | |
| 6,340,846 B1 | 1/2002 | LoBianco et al. | |
| 6,376,904 B1 | 4/2002 | Haba et al. | |
| 6,388,313 B1 | 5/2002 | Lee et al. | |
| 6,400,007 B1 | 6/2002 | Wu et al. | |
| 6,407,456 B1 | 6/2002 | Ball | |
| 6,413,798 B2 | 7/2002 | Asada | |
| 6,414,381 B1 | 7/2002 | Takeda | |
| 6,424,050 B1 | 7/2002 | Komiyama | |
| 6,441,496 B1 | 8/2002 | Chen et al. | |
| 6,445,064 B1 * | 9/2002 | Ishii et al. | 257/686 |
| 6,462,421 B1 | 10/2002 | Hsu et al. | |
| 6,472,732 B1 | 10/2002 | Terui | |
| 6,472,741 B1 * | 10/2002 | Chen et al. | 257/712 |
| 6,489,676 B2 | 12/2002 | Taniguchi et al. | |
| 6,492,726 B1 | 12/2002 | Quek et al. | |
| 6,501,165 B1 | 12/2002 | Farnworth et al. | |
| 6,512,303 B2 | 1/2003 | Moden | |
| 6,538,319 B2 | 3/2003 | Terui | |
| 6,545,365 B2 | 4/2003 | Kondo et al. | |
| 6,545,366 B2 | 4/2003 | Michii et al. | |
| 6,552,423 B2 * | 4/2003 | Song et al. | 257/679 |
| 6,555,902 B2 | 4/2003 | Lo et al. | |
| 6,570,249 B1 | 5/2003 | Liao et al. | |
| 6,583,503 B2 | 6/2003 | Akram et al. | |
| 6,590,281 B2 | 7/2003 | Wu et al. | |
| 6,593,647 B2 | 7/2003 | Ichikawa | |
| 6,593,648 B2 | 7/2003 | Emoto | |
| 6,593,662 B1 * | 7/2003 | Pu et al. | 257/777 |
| 6,599,779 B2 | 7/2003 | Shim et al. | |
| 6,600,222 B1 * | 7/2003 | Levardo | 257/686 |
| 6,607,937 B1 | 8/2003 | Corisis | |
| 6,611,063 B1 | 8/2003 | Ichinose et al. | |
| 6,621,169 B2 | 9/2003 | Kikuma et al. | |
| 6,621,172 B2 | 9/2003 | Nakayama et al. | |
| 6,649,448 B2 | 11/2003 | Tomihara | |
| 6,650,019 B2 | 11/2003 | Glenn et al. | |
| 6,667,556 B2 | 12/2003 | Moden | |
| 6,690,089 B2 | 2/2004 | Uchida | |
| 6,700,178 B2 | 3/2004 | Chen et al. | |
| 6,716,676 B2 * | 4/2004 | Chen et al. | 438/122 |
| 6,734,539 B2 | 5/2004 | Degani et al. | |
| 6,734,552 B2 | 5/2004 | Combs et al. | |
| 6,737,750 B1 | 5/2004 | Hoffman et al. | |
| 6,746,894 B2 | 6/2004 | Yin et al. | |
| 6,747,361 B2 | 6/2004 | Ichinose | |
| 6,762,488 B2 | 7/2004 | Maeda et al. | |
| 6,768,191 B2 * | 7/2004 | Wennemuth et al. | 257/686 |
| 6,777,799 B2 | 8/2004 | Kikuma et al. | |
| 6,777,819 B2 | 8/2004 | Huang | |
| 6,787,915 B2 | 9/2004 | Uchida et al. | |
| 6,787,916 B2 | 9/2004 | Halahan | |
| 6,818,980 B1 | 11/2004 | Pedron, Jr. | |
| 6,828,665 B2 | 12/2004 | Pu et al. | |
| 6,835,598 B2 * | 12/2004 | Baek et al. | 438/109 |
| 6,838,761 B2 | 1/2005 | Karnezos | |
| 6,847,105 B2 | 1/2005 | Koopmans | |
| 6,864,566 B2 | 3/2005 | Choi, III | |
| 6,890,798 B2 | 5/2005 | McMahon | |
| 6,900,528 B2 | 5/2005 | Mess et al. | |
| 6,906,415 B2 | 6/2005 | Jiang et al. | |
| 6,906,416 B2 * | 6/2005 | Karnezos | 257/723 |
| 6,930,378 B1 | 8/2005 | St. Amand et al. | |
| 6,930,396 B2 | 8/2005 | Kurita et al. | |
| 6,933,598 B2 | 8/2005 | Karnezos | |
| 6,951,982 B2 | 10/2005 | Chye et al. | |
| 6,972,481 B2 | 12/2005 | Karnezos | |
| 7,034,387 B2 | 4/2006 | Karnezos | |
| 7,045,887 B2 * | 5/2006 | Karnezos | 257/686 |
| 7,049,691 B2 | 5/2006 | Karnezos | |
| 7,053,476 B2 | 5/2006 | Karnezos | |
| 7,057,269 B2 | 6/2006 | Karnezos | |
| 7,061,088 B2 | 6/2006 | Karnezos | |
| 7,064,426 B2 | 6/2006 | Karnezos | |
| 7,071,568 B1 | 7/2006 | St. Amand et al. | |
| 7,081,678 B2 | 7/2006 | Liu | |
| 7,101,731 B2 | 9/2006 | Karnezos | |
| 2002/0079573 A1 | 6/2002 | Akram | |
| 2002/0096755 A1 | 7/2002 | Fukui et al. | |
| 2002/0130404 A1 | 9/2002 | Ushijima et al. | |
| 2003/0062629 A1 | 4/2003 | Moden | |
| 2003/0113952 A1 | 6/2003 | Sambasivam et al. | |
| 2003/0153134 A1 | 8/2003 | Kawata et al. | |
| 2003/0203537 A1 | 10/2003 | Koopmans | |
| 2004/0016939 A1 | 1/2004 | Akiba et al. | |
| 2004/0018661 A1 | 1/2004 | Baek et al. | |
| 2004/0061213 A1 | 4/2004 | Karnezos | |
| 2004/0119152 A1 * | 6/2004 | Karnezos et al. | 257/686 |
| 2004/0212096 A1 | 10/2004 | Wang | |
| 2004/0262724 A1 * | 12/2004 | Hsu | 257/678 |
| 2006/0043556 A1 | 3/2006 | Su et al. | |
| 2006/0138631 A1 | 6/2006 | Tao et al. | |

FOREIGN PATENT DOCUMENTS

| | | |
|---|---|---|
| JP | 05-206365 A | 8/1993 |
| JP | 2006-522478 A | 9/1998 |
| JP | 10-284683 A | 10/1998 |
| JP | 11-251515 A | 9/1999 |
| JP | 2000-294723 A | 10/2000 |
| JP | 2001-102515 A | 4/2001 |
| JP | 2001223326 A | 8/2001 |
| JP | 2002-170921 A | 6/2002 |
| JP | 2002-176136 A | 6/2002 |
| JP | 2002-222903 A | 8/2002 |
| JP | 2003-110084 A | 4/2003 |
| JP | 2003-197857 A | 7/2003 |

(56) References Cited

FOREIGN PATENT DOCUMENTS

| | | |
|---|---|---|
| JP | 2003-273317 A | 9/2003 |
| KR | 20010688614 A | 7/2001 |
| KR | 2004085348 A | 10/2004 |
| WO | 02/089207 A2 | 11/2001 |

\* cited by examiner

MULTIPLE CHIP PACKAGE MODULE HAVING INVERTED PACKAGE STACKED OVER DIE

CROSS-REFERENCE TO RELATED APPLICATIONS

This application claims the benefit of U.S. Provisional Application No. 60/530,423, filed 17 Dec. 2003, titled "Multiple chip package module having inverted package stacked over die", which is hereby incorporated herein by reference.

BACKGROUND

This invention relates to semiconductor chip packaging.

Portable electronic products such as mobile telephones, mobile computers, and various consumer products require higher semiconductor functionality and performance in a limited footprint and minimal thickness and weight at the lowest cost. This has driven the industry to increase integration on the individual semiconductor chips.

More recently the industry has begun implementing integration on the "z-axis," that is, by stacking chips, and stacks of up to five chips in one package have been used. This provides a dense chip structure having the footprint of a one-chip package, in the range of 5×5 mm to 40×40 mm, and obtaining thicknesses that have been continuously decreasing, as the technology develops, from 2.3 mm to 0.5 mm. The packaging cost for a stacked die package is only incrementally higher than the packaging cost for a single chip package, and assembly yields have been high enough to assure a competitive final cost compared to packaging the chips in individual packages.

A primary practical limitation to the number of chips that can be stacked in a stacked die package is the low final test yield of the stacked-die package. Inevitably one or more of the chips in some packages will be defective. Therefore, the final package test yield, which is the product of the individual die test yields, always will be significantly less than 100%. Where one die in a package has low yield because of design complexity or technology, final package yields can be unacceptably low even if only two die are stacked in each package.

The dimensions of the various die that may be supplied for use in a particular device can vary significantly, and this presents challenges in construction of stacked die packages. For example, in a conventional stacked die package the upper die may be a memory die and the lower die may be a digital signal processor (DSP). The assembler's favored memory die may be larger than the favored DSP die. Or, adjacent stacked die in the package may both be memory die, with the upper die being the same size as, or larger than the lower die. The yield of DSP is typically low, and where the lower die in a stacked die package is a DSP, it may be impossible in practice to test the DSP until after it is placed on the substrate; and where the DSP is wire bonded it may be impossible in practice to test the die on the substrate because the handling during testing causes damage to exposed wires. In a conventional stacked die package, therefore, the upper die must be stacked over the lower die before the lower die can be tested, and where the lower die proves at that point in the process to be unacceptable, the stacked package must be discarded, resulting in a waste both of the spacer and the upper die and of processing steps for stacking them.

Another limitation in stacked die packages is the low power dissipation capability of the package. The heat is transmitted from one die to the other and the only significant path for heat dissipation out from the package is through the solder balls to the motherboard. Conduction of heat to the ambient through the top of the package is very limited because the molding compound typically does not conduct heat well.

FIG. 1 is a diagrammatic sketch in a sectional view illustrating the structure of a conventional stacked die package having two die stacked with a spacer between them. The stacked die package, shown generally at 10, includes a first die 14 attached onto a substrate 12 having at least one metal layer, and a second 24, stacked over the first die 12, the first and second die in the stack being separated by a spacer 22.

Any of various substrate types may be used, including for example: a laminate with 2-6 metal layers, or a build up substrate with 4-8 metal layers, or a flexible polyimide tape with 1-2 metal layers, or a ceramic multilayer substrate. The substrate 12 shown by way of example in FIG. 1 has two metal layers 121, 123, on opposite sides of a dielectric 120, each metal layer being patterned to provide appropriate circuitry and connected through the dielectric by way of vias 122.

The first die 14 is conventionally attached to a surface of the substrate using an adhesive, typically referred to as the die attach epoxy, shown at 13 in FIG. 1 and, in the configuration in FIG. 1, the surface of the substrate onto which the die is attached may be referred to as the "upper" surface, and the metal layer on that surface may be referred to as the "upper" metal layer, although the die attach surface need not have any particular orientation in use. The spacer 22 is affixed to the upward-facing (active) surface of the first die 14 by an adhesive 21 and the second die 24 is affixed to the upward-facing surface of the spacer 22 by an adhesive 23.

In the stacked die package of FIG. 1 the die are wire bonded onto wire bond sites on the upper metal layer of the substrate to establish electrical connections; wire bonds 16 connect the first die 14 to the substrate and wire bonds 26 connect the second die 24 to the substrate. The die 14 and 24 and the wire bonds 16 and 26 are encapsulated (typically by array molding and saw singulation, to make a standard "chip scale package") with a molding compound 17 that provides protection from ambient and from mechanical stress to facilitate handling operations, and provides a surface for marking for identification. Solder balls 18 are reflowed onto bonding pads on the lower metal layer of the substrate to provide interconnection to the motherboard (not shown) of a final product, such as a computer. Solder masks 125, 127 are patterned over the metal layers 121, 123 to expose the underlying metal at bonding sites for electrical connection, for example the wire bond sites and bonding pads for bonding the wire bonds 16, 26 and solder balls 18.

As will be appreciated, the wire bonds 16 have a characteristic "loop height", which (together with a loop height tolerance) is a parameter of the wire-bonding process, and sufficient spacing must be provided between the second and the first die to avoid damage to the wire bonds by impact with the second die. Accordingly, the spacer 22 is provided as a pedestal to support the second die 24 over the first die 14. The spacer is made narrow enough so that it does not impact the wire bonds at its edges, and thick enough to provide spacing sufficient to hold the second die above the wire loops; that is, the spacer itself does not impact the wires, and it provides sufficient distance between the first and second die so that the downward-facing side of the second die does not damage the wire bonds 16.

The stacked die package as shown in FIG. 1 is well established in the industry. Such a package has a footprint as small as about 1.7 mm larger than the largest die it contains, and it can be made to a thickness profile as low as 0.8 mm to 1.4 mm. It can have lower cost compared to individually packaged die.

Contributions to the thickness of such a stacked die package by the various parts are shown by way of illustration in various two-die stacked die package configurations in the Table, following. Abbreviations such as "CT" for die thickness are placed on FIG. 1 for reference.

TABLE

| | | | | Overall Package Height "OT" (Max) | | | |
|---|---|---|---|---|---|---|---|
| | Dimension | | | 1.4 mm | 1.2 mm | 1.0 mm | 0.8 mm |
| Mold | Die thickness | "CT" | (Max) | 0.150 | 0.132 | 0.087 | |
| Cap | Spacer die thickness | "SPT" | (Max) | 0.125 | 0.125 | 0.087 | |
| | Loop height | "LH" | (Max) | 0.115 | 0.089 | 0.075 | |
| | Mold height | "MH" | (Nom) | 0.700 | 0.650 | 0.500 | 0.370 |
| Substrate | Substrate thickness | "ST" | (Nom) | 0.260 | 0.210 | 0.190 | 0.170 |
| Ball | Ball diameter | "BD" | (Nom) | 0.400 | 0.350 | 0.350 | 0.300 |
| | (option) | "BD" | (Nom) | 0.450 | | 0.300 | 0.350 |
| | Collapse height | "CH" | (Min) | 0.250 | 0.250 | 0.150 | 0.150 |
| | (option) | "CH" | (Min) | 0.300 | | | 0.150 |

A principal limitation of such a structure is the low final test yield of the package, particularly if at least one die has a low yield. For instance, a memory die may be stacked over a processor die. Memory usually requires a "burn-in" test to eliminate "infant mortality". A processor usually is a complex design, and yields of processor die are typically less than 99%. The final test yield of the package is the product of the yields of the individual die. It is possible in principle to increase the final yield by obtaining Known Good Die ("KGD"). But KGD are of limited availability and higher cost, and KGD memory die are particularly costly.

The use of a "dummy" die as a spacer, as illustrated above, requires steps of applying adhesive layers between the spacer and the die between which the spacer is interposed. There is a limit on how thin the dummy die can in practice be made, and this imposes a lower limit on the spacer die thickness. Accordingly various approaches have been suggested for providing a separation between adjacent die in stacked die packages. In some approaches a thick adhesive layer between the adjacent die provides the separation. To the extent the adhesive may collapse during the stacking process, the standoff may be difficult to control, and the planes of the adjacent die may be not be parallel. In some such approaches the spacer adhesive is filled with particles having a dimension suitable to provide the standoff between the die and to prevent die tilt. Various spacer adhesives are described in, for example, in U.S. Pat. No. 6,472,758 and U.S. Pat. No. 6,340,846, each of which is hereby incorporated herein by reference in its entirety.

Another approach to integrating on the "z-axis" is to stack die packages to form a multi-package module. Stacked packages can provide numerous advantages as compared to stacked-die packages.

For instance, each package in a stacked package module can be electrically tested, and rejected unless it shows satisfactory performance, before the packages are stacked. As a result the final stacked multi-package module yields can be maximized. While "naked" die can be tested, testing can be more readily carried out in the package, particularly where the pad pitch on the die is very small.

SUMMARY

This invention is directed to multiple chip modules ("MCM"), including a bottom (lower) package, and an inverted top (upper) package stacked over a die on the bottom package. Generally, rather than having an upper die stacked over a lower die, as in a stacked die package, an inverted upper package (such as a land grid array package) is stacked over the lower die, with provision where necessary (such as by a spacer) for a standoff between the upper package and the lower die. The standoff or spacer, where provided, physically separates the upper package from the lower die; as a consequence, the lower die can be wire bonded to the lower substrate, and z-interconnect can be made by wire bonding between the upper package substrate and the lower package substrate (or the lower die). The MCM according to the invention can be built using existing manufacture infrastructure as employed in die stacking with provision for spacing between adjacent die.

According to an aspect of the invention, a package such as a land grid array ("LGA") package is inverted and stacked over a ball grid array ("BGA") package. The BGA package includes at least one die mounted on a substrate. Where the lower package die is connected to the lower substrate by wire bonds a spacer can be affixed onto the upward facing (active) side of the die; and the inverted package is affixed onto the upward facing side of the spacer. Z-interconnection between the inverted package and the BGA package in the MCM is wire bond based; that is, wire bonds connect z-interconnect wire bond pads on the upward facing side of the inverted upper (LGA) package with pads on the die itself on the lower (BGA) package, or with z-interconnect wire bond pads on the upward-facing side of the lower (BGA) package substrate, or both with pads on the lower package die and with pads on the lower package substrate. Generally, the invention features various configurations of various such stacked packages, having an inverted LGA package stacked upon a die on a BGA package, and methods for stacking and interconnecting the various packages by wire-bonding based z-interconnection.

In various aspects of the invention the connection of the upper package die and the upper package substrate can be by flip chip or wire bond interconnection; the inverted upper package can include any of a variety of LGA packages, such as a laminate or buildup substrate-based LGA or a tape-based LGA, and/or any of a variety of "QFN" packages or bump chip carrier ("BCC") packages; the inverted package can include one die or can include two or more die, and where two or more die are included in the inverted package the die can be stacked or they can be arranged side-by side on the inverted package substrate; the lower package can include one die or can include two or more die, and where two or more die are included in the lower package the die can be stacked or they can be arranged side-by side on the inverted package substrate, and where the lower package is a stacked die package the inverted package is mounted over the uppermost one of the stacked die; the package stack can include one or more packages having a flip chip die bonded either to the top or to the bottom of the BGA or LGA; the package stack can include a thermal enhancement feature enabled by a heat spreader over the upper package; and the stack can include any substrate, laminate or build-up or flexible or ceramic, provided that the z-interconnect pads are made available for bonding on the periphery of the packages.

In one general aspect the invention features a multiple chip module having stacked first (lower) and second (upper) packages, each package including a die attached to a substrate, in which the upper package is inverted, and in which the upper package is stacked over a die on the lower package with provision for spacing between the upper package and the lower package die. Because the die and wire bonds on the lower package are not encapsulated before the upper package is stacked over the lower die, the spacing is provided to prevent damage to the wire bonds connecting the lower die to the lower package substrate. Accordingly, the thickness dimension of the spacing is determined according to the loop height of the wire bonds.

The invention provides for excellent manufacturability, high design flexibility, and low cost to produce a multiple chip package module having a low profile and a small footprint.

The wire bond z-interconnect is well established in the industry; it is the lowest cost interconnect technique and it is directly applicable, without significant modification, to the stacked multiple chip modules of the invention. It provides design flexibility to the relative size of the BGA to LGA that can be bridged by wire length. Using available techniques and equipment the wire in a wire bond can be as short as 0.5 mm or as long as 5 mm. The arrangement of the z-interconnect pads can be implemented through either or both BGA and LGA substrate designs. Moreover, using wire bonds according to the invention z-interconnect can be formed between pads that are not precisely aligned over one another, by employing so-called "out of sequence bonding" that is in current use in the industry. The wire bonding pitch is the finest available technology in the industry at 50 microns currently, and projected to go to 25 microns. This is finer than any other interconnect including flip chip (around 200 microns) or solder balls (at about 500 microns), and therefore provides for more interconnects between packages (z-interconnects) in the same available space.

Wire bonding using a wire bonding machine provides design flexibility for interconnecting pads, because the connections are programmed in the wire bonder, avoiding the need for hard tooling substrates to match each other and connect with solder balls. When the relative BGA and LGA package sizes change, the wire bonding can be reconfigured to accommodate the differences by program changes. If the top package must be smaller than the bottom, wire bonding can accommodate size differences at least up to 9 mm. This allows for use of the smallest package needed to accommodate the chip size, and thus optimizes the total cost of the MCM.

Wire bonding can interconnect pads that are "out of sequence," that is, not situated in the desired order and not precisely above each other in either package, so long as they are not too far apart. Where necessary, the pads can be appropriately routed to a location close enough for wire bonding. This flexibility allows stacking of packages that do not have the "desired" order or location of interconnect pads. As the chip technology advances usually the chip size shrinks and design variants are developed with either more connections or some connections with different order. The bonding flexibility provided by wire bonding allows the user to maintain the same package size but vary the substrate design. This results in lower cost and faster time to market, both critical for new products.

The BGAs and LGAs, including chip scale packages, are standard in the industry, providing the lowest cost and the widest availability. This provides significant flexibility in selecting the packages to be stacked and, therefore, in the kinds of functions that can be integrated into the MCM according to the invention.

A typical LGA thickness is 0.8 mm. A typical die thickness can range from less than about 0.09 mm to about 0.15 mm, and a typical silicon spacer ("dummy" die spacer) thickness can range from less than about 0.09 mm to about 0.125 mm. The stacking of the spacer over the lower die and of the inverted LGA over the spacer according to the invention can be completed using an adhesive having a finished thickness in the range 10-50 microns.

Or, a "filled" spacer adhesive can be employed to provide adhesion and spacing between the lower package die and the upper package. Such an adhesive spacer can provide for an even closer spacing between the upper package and the lower die, approaching the loop height of the wire bonds connecting the lower package die to the lower package substrate. This structure can provide for a lower profile MCM. The footprint of the MCM according to the invention is determined by the maximum chip size of the stack. A typical minimum footprint for the BGA or LGA is 1.7 mm larger than the die size. The wire bond z-interconnect generally requires that the top LGA be minimally smaller than the bottom BGA, by about 0.1 mm to 0.8 mm, to accommodate the wires without shorting to the substrate metal edges. If the top package must be significantly smaller than the bottom package, wire bonding can accommodate size differences at least up to 9 mm. This allows for minimizing the size of the package needed to accommodate the chip size, and thus for optimizing the total cost of the MCM. Both the footprint and the thickness of the stacked package MCM according to the invention fall within accepted ranges for most applications.

Alternatively, where the top package is much smaller than the lower package die, so that pads on the upward-facing side (active) side of the lower package die project beyond the margin of the inverted upper package substrate, z-interconnect between the upper package and the lower die can be made by wire bonding directly from the z-interconnect pads on the upward-facing side of the upper package substrate and the pads on the die.

In some embodiments the multiple chip module can include an additional package, mounted over the inverted LGA package; in some such embodiments the additional package is an LGA package, and in some such embodiments the additional LGA package is wire bonded to the inverted LGA package substrate and/or is wire bonded to the lower package substrate. In some embodiments the MCM can include one or more additional die, mounted over the inverted LGA package; in some such embodiments the additional die can be wire-bonded to the upper package substrate and/or to the lower package substrate.

In one general aspect the invention features a multi-package module having stacked first ("bottom") and second ("top") packages, the first package being a BGA package having a die attached to a substrate, and the second package being an LGA package, including a die attached to a substrate, in which the second package is inverted so that the substrate surface to which its die is attached is downward-facing, and in which the inverted package is affixed over the first package die, with provision for spacing between the first package die and the inverted second package. In some embodiments the second package is an LGA package, and in some embodiments the second package is a saw-singulated package, and it may be a chip scale package. In some embodiments the second package has a tape-based package substrate. In some embodiments the second package is a bump chip carrier package.

In some embodiments the second package is provided with a heat spreader, and an upward-facing surface of the heat spreader is exposed to ambient at the topmost surface of the MCM. In some embodiments the heat spreader can be affixed to the upward facing surface of the topmost LGA package or, where an additional die is provided on the second package, the heat spreader can be affixed to the upward facing surface of the topmost die, and where the inverted second package is the uppermost package in the module the heat spreader can be affixed to the upward facing side of the inverted second package; in other embodiments the heat spreader is not affixed to the topmost package or die but is molded in at the topmost surface of the MCM, and in these embodiments too the heat spreader is exposed to ambient at the topmost surface of the MCM. Heat dissipation may additionally be enhanced by employing an electrically nonconductive heat-conducting molding for the module encapsulation.

In another general aspect, methods for making multiple chip package modules according to the invention include providing a first package having a first die attached onto an upward facing side of a first package substrate, and stacking an inverted second package over the die on the first package, provision being made for a standoff between the second package and the first package die to avoid damaging impact between the downward-facing side of the second package and wire bonds connecting the first die to the first package substrate.

According to the invention, the inverted upper package can be an array molded and saw-singulated package or a cavity-molded and punch-singulated package; the lower package, on the other hand, is not molded prior to stacking the upper package over the lower package die. The package module according to the invention is molded following stacking, and the MCM accordingly can be array molded and saw singulated, or, it can be cavity molded and punch singulated.

The invention provides for modules having more than one chip in a thin package having a minimal footprint. Modules according to the invention can have thickness profiles of, for example, about 1.2 mm or 1.4 mm, or other profiles accepted as standard.

Standard packages can be used for both the bottom and top packages. The top package can be assembled for example as a cavity-molded and punch singulated land grid array (LGA) package or as a standard saw singulated LGA package having a laminate substrate, for example, or as a QFN package, or a tape-substrate-based LGA package, or "bump chip carrier" (BCC) package, for example.

The invention is useful particularly in devices employing multiple die modules known variously as "multi chip package" ("MCP") or "system in package" ("SiP") or "multi package module" ("MPM"). Multiple chip package modules according to the invention can be used in construction of computers, telecommunications, and consumer and industrial electronics. The invention can be particularly useful in portable electronic devices.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1:
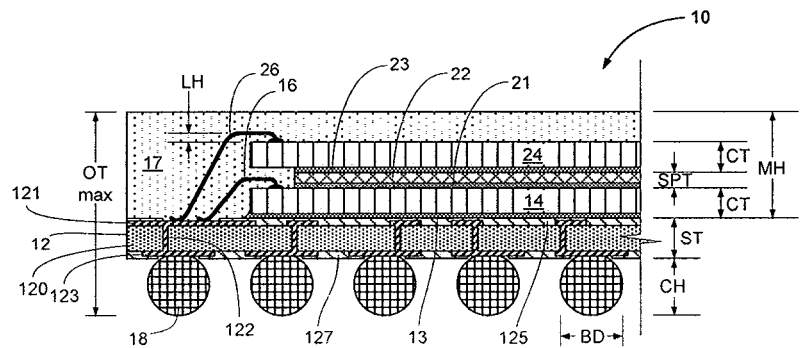
FIG. 1 is a diagrammatic sketch in a sectional view showing a portion of a conventional stacked die package.

FIG. 1 is discussed above with reference to conventional stacked die packaging.

Figure 2:
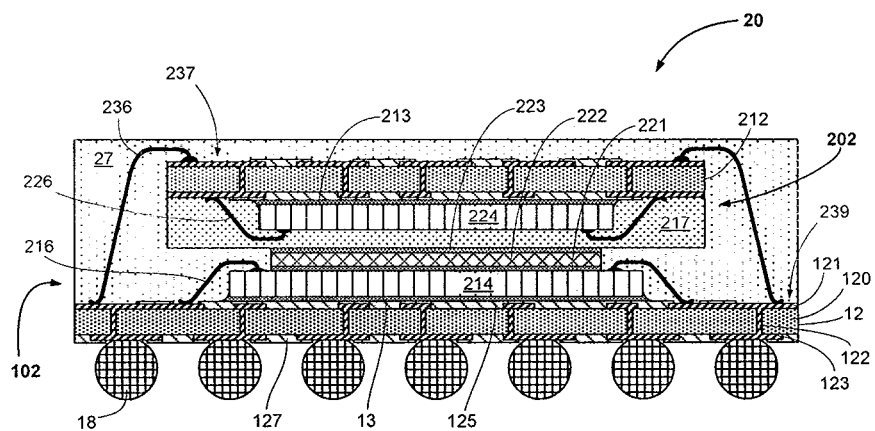
FIG. 2 is a diagrammatic sketch in a sectional view showing a multiple chip package according to an embodiment of the invention, having a lower BGA package with a spacer over a wire-bonded die, and an inverted LGA package stacked over the spacer on the lower package die.

FIG. 2 shows a chip scale package (CSP) module 20 according to one aspect of the invention. The module 20 contains two die 214, 224, in which in effect an inverted molded LGA package 202 is stacked on a die 214 in a lower package 102. The lower die 214 is mounted on a substrate 12 in substantially the same manner as the lower die in a conventional stacked die package, as described above with reference to FIG. 1 by way of example, and, in fact, the lower die and its substrate may be supplied just as for a conventional stacked die package, but without molding. That is, in the example shown here, the lower die 214 is mounted active side upward using a die attach epoxy 13 onto an upward-facing side of a BGA substrate 12 having two to four patterned metal layers, and the die is wire-bonded to wire bond sites on the upper metal layer of the BGA substrate. Solder balls 18 are mounted onto the downward facing side of the lower substrate to provide for second level interconnection with underlying circuitry as, for example, a motherboard (not shown). Thus the lower die and the lower substrate on which it is mounted can constitute a standard BGA package (nonmolded). Multiple such packages can be made in a strip or array.

With reference still to FIG. 2, in this embodiment the bottom package includes a die attached onto a bottom package substrate having at least one metal layer. Any of various substrate types may be used, including for example: a laminate with 2-6 metal layers, or a build up substrate with 4-8 metal layers, or a flexible polyimide tape with 1-2 metal layers, or a ceramic multilayer substrate. The bottom package substrate shown by way of example in FIG. 2 has two metal layers 121, 123, each patterned to provide appropriate circuitry and connected through dielectric 120 by way of vias 122. The die is conventionally attached to a surface of the substrate using an adhesive 13, typically referred to as the die attach epoxy and, in the configuration in FIG. 2, the surface of the substrate onto which the die is attached may be referred to as the "upper" surface, and the metal layer on that surface may be referred to as the "upper" metal layer, although the MCM and, consequently, the die attach surface need not have any particular orientation in use. The terms "upper" and "lower" and "upward" and "downward", and grammatical variants of these terms, are used herein in the context of the MCM as appearing in the FIGs.

In the bottom BGA package of FIG. 2 the die 214 is wire bonded (wires 216) onto wire bond sites on the upper metal layer 121 of the substrate to establish electrical connections. The connections to the die are exposed at the periphery of the package with pads on the top metal layer of the substrate and available for connecting with wire bonds as described in more detail below with reference to FIGS. 3A and 3B. The physical location and order of these pads is arranged so as to approximately lie under the equivalent pads on the LGA situated above. Solder balls 18 are reflowed onto bonding pads on the lower metal layer 123 of the substrate 12 to provide interconnection to underlying circuitry of, for example, a motherboard (not shown in the FIGs.) of a final product, such as a computer. Solder masks 125, 127 are patterned over the metal layers 121, 123 to expose the underlying metal at bonding sites for electrical connection, for example the wire bond sites and bonding pads for bonding the wire bonds and solder balls.

A spacer 222 is affixed using an adhesive 221 onto the upward facing (active) surface of the lower die 214. The spacer may be a solid piece, as shown here, which may be glass or a dummy silicon chip, for example; or spacing may be provided by a spacer adhesive. As in the conventional stacked die package the spacer must be thick enough to provide sufficient standoff to accommodate the loop height of the bottom package wire bonds 216, and—where a solid spacer such as a dummy die is employed—the footprint of the spacer must be small enough that it does not contact the wire bonds at or near the die pads.

Where the spacer is a solid piece, such as a dummy die, it is affixed onto the upward facing surface of the die using a die attach adhesive of a type that has a soft filler, such as Teflon particles, that will not damage the circuitry of the die.

Other spacer constructs can be employed in the modules according to the invention. Where the spacer is a solid piece, as shown in the FIGs., one or both of the adhesives may be provided as an adhesive film. Spacer constructs having film adhesives, and methods for constructing device stacks using them, are described for example in U.S. patent application Ser. Nos. 10/959,713, 10/976,601, 10/959,659. Where the spacer is a spacer adhesive, any of various adhesive spacer configurations may be employed, for example as described in U.S. patent application Ser. Nos. 10/966,572, 10/966,574, 10/969,116, 10/969,303. Each of the aforementioned patent applications is incorporated by reference herein.

The inverted LGA package 202 includes a die 224 mounted on a substrate 212 using a die attach adhesive 213. The die 224 is electrically connected to the substrate 212 by wire bonds 226, and the die and wire bonds and the die attach side of the substrate are encapsulated or molded 217 using a molding compound or encapsulant. The inverted package 202 is electrically interconnected ("z-interconnect") to the bottom package 102 by wire bonds 236, and the top package 202, the bottom die 214 and the spacer 222, the wires 236 and 216, and the die attach surface of the substrate 12 are encapsulated with an encapsulant 27. The wire bonds 236 are in direct contact with an upward facing side 237 of the substrate 212. The wire bonds 236 are attached directly to a top side 239 of the substrate 12 and the upward facing side 237 of the substrate 212.

In the stacked package embodiment of FIG. 2, the z-interconnect pads on the respective package substrates are arranged on upward facing metal layers near the margins of the package substrates. The location and order of the z-interconnect pads are generally arranged so that the z-interconnect pads on the top package substrate approximately overlie the corresponding z-interconnect pads on the bottom package when the packages are stacked. Conveniently, the top package has a smaller substrate footprint than that of the bottom substrate, to allow clearance for the wire bonds without electrical shorting to the edges of the metal layers of the substrates. In such cases, the substrate 212 of the inverted LGA package 202 can be smaller than the substrate 12 of the lower package 102 and the inverted LGA package 202 can completely overlie or be formed directly over the entirety of the wires 216, which connect the die 214 with the wire bond sites on the upper metal layer 121 of the substrate 12.

Figure 3A:
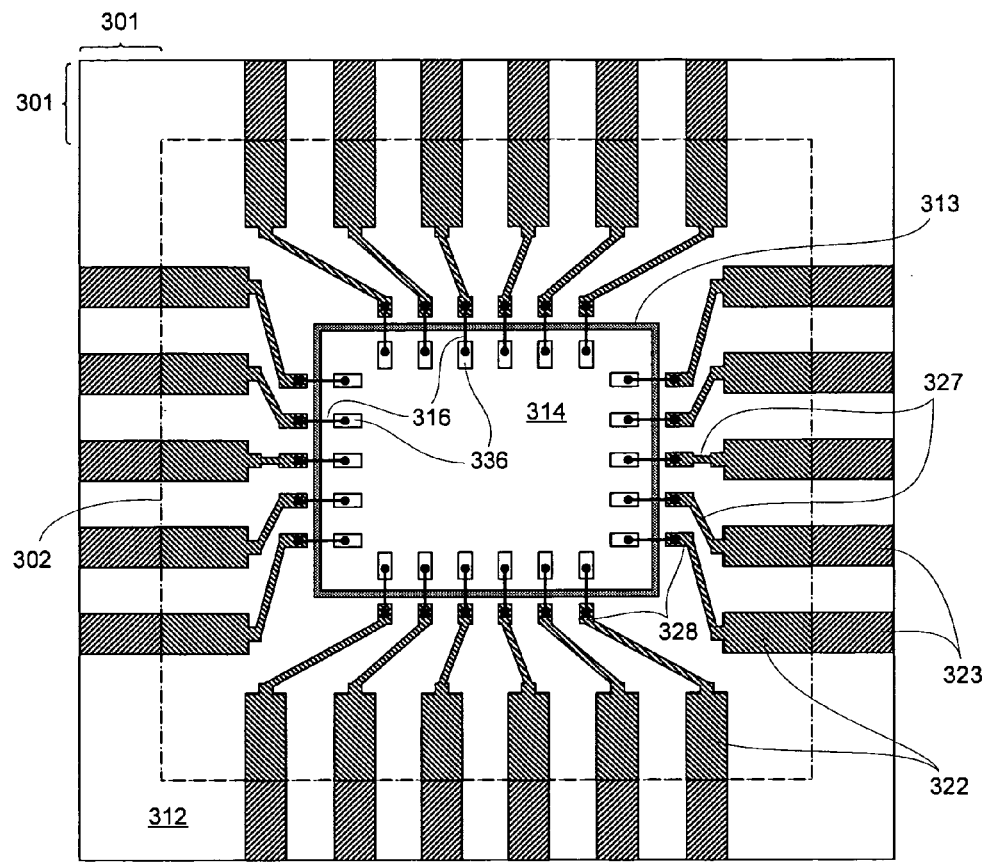
FIG. 3A is a diagrammatic sketch in a plan view showing the upward facing side of a bottom package in a multiple chip package according to an embodiment of the invention.
Figure 3B:
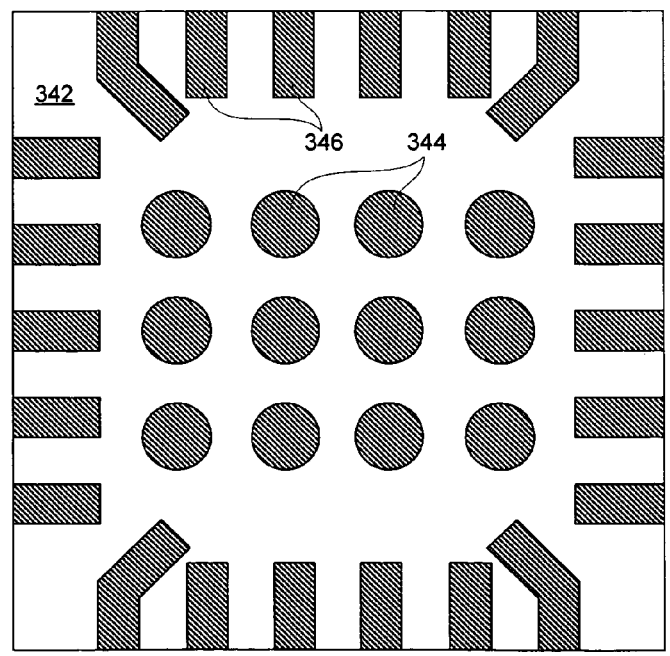
FIG. 3B is a diagrammatic sketch in a plan view showing the downward facing side of a top package in a multiple chip package according to an embodiment of the invention.

The arrangements of the z-interconnect pads on the upper and lower substrates are shown by way of example in diagrammatic plan view in FIGS. 3A and 3B.

FIG. 3A shows diagrammatically a lower die 314 affixed using a die attach adhesive 313 onto the upward facing side of the lower substrate 312. Z-interconnect bond pads 322 arranged on the perimeter of the substrate 312 are exposed (at least in part, 323) in the margin 301 beyond the footprint 302 of the top package to provide bond sites for z-interconnection between the lower substrate and the upper substrate. The z-interconnect bond pads 322 on the lower substrate are connected by way of traces 327 to bond fingers 328, which are exposed at least in part to provide wire bond sites for connection by wire bonds 316 of exposed bond pads 336 on the active side of the lower die 314 and the patterned metal layer on the lower substrate. The z-interconnect bond pads on the upward facing side of the lower substrate are connected to one or more other patterned layers in the substrate (and eventually to the second level solder balls) by way of vias through the substrate dielectric.

Referring again to FIG. 2, the upper package in this illustrative example is a molded land grid array package. The upper LGA package is inverted so that the molding 217 surface, which ordinarily forms a top surface of the package, faces downward in the module; and the surface of the LGA package substrate opposite the die attach surface, which ordinarily constitutes a bottom surface of the LGA package, faces upward in the module. As noted above, the upper package is tested as "good" and is affixed onto the upper surface of the spacer using an adhesive 223, which may be similar to the die attach adhesive. In at least one embodiment, the upper package can be stacked upon the spacer 222 with only the adhesive 223 formed between the upper package and the spacer 222.

In the embodiment shown in FIG. 2, the top package is a land grid array ("LGA") package which may be a saw singulated LGA package, and may be a chip scale package; but here the top package has no solder balls mounted on bonding pads of the lower surface of the substrate (upward facing in the inverted package). Particularly, in this example, the top package includes a die attached onto a top package substrate having at least one metal layer. Any of various substrate types may be used; the top package substrate 212 shown by way of example in FIG. 2 has two metal layers, each patterned to provide appropriate circuitry and connected by way of vias. The die is conventionally attached to a surface of the substrate using an adhesive 213, typically referred to as the die attach epoxy. The die is referred to as being attached to an upper surface of the package substrate, it being appreciated that the package need not have any particular orientation in use. According to the invention, the top package is inverted, that is to say, it is attached upside downward and downside upward. Because the upper LGA is inverted in the module, so that it is relatively speaking upside-down or downside-up, the surface of the upper LGA to which the first die is attached, which would customarily be termed the upper surface or upper side of the LGA substrate, is referred to in the text herein as the downward or downward facing surface of the inverted LGA; and the opposite surface, which would customarily be termed the lower surface or lower side, is referred to in the text herein as the upward or upward facing surface.

In the configuration in FIG. 2, for example, the surface of the top package substrate onto which the die is attached faces toward the bottom package, and, accordingly the "upper" surface of the top package, to which the die is affixed, is here referred to as the "downward facing" surface of the top package substrate, it being appreciated again that the module need not have any particular orientation in use. That is to say, once the top package has been inverted in the module according to the invention, for purposes of description the surface of the top package substrate having the "upper" metal layer is said to be "downward facing", and the surface of the top package substrate having the "lower" metal layer is said to be "upward facing".

In the top LGA package in the embodiment of FIG. 2 the die 224 is wire bonded (wires 226) onto wire bond sites on the upper metal layer of the top package substrate 212 to establish electrical connections. The die and the wire bonds are encapsulated with a molding compound 217 that provides protection from ambient and from mechanical stress to facilitate handling operations, and has a top package upper surface. The top package is inverted (so that the surface f the molding is "downward facing", and is stacked over the spacer 222 on the lower die and affixed there using an adhesive 223. Solder masks are patterned over the metal layers of the top package substrate 212 to expose the underlying metal at bonding sites for electrical connection, for example the wire bond sites for bonding the wire bonds.

Because according to the invention the upper package (and, hence, the upper die) can be tested, it may be preferred, for purposes of maximizing yield, to place the die having the expected higher yield in the lower package, and to mount the die having expected lesser yield in the top package. In that way, rejected upper packages can be discarded prior to assembly of the stack, so that the overall yield of completed packages is affected principally by the yield of the expected higher yield die, rather than by the yield of the expected lower yield die. However, the assembler may prefer to have the lower yield die in the lower package. For instance, the assembler may wish to have a memory die over a DSP. In such a case the assembler accepts a known yield risk for the lower die, but, according to the invention, the assembler need not accept a yield risk for the upper die, because the upper die can be tested in its package (and rejected ones can be discarded) prior to forming the stack.

FIG. 3B shows diagrammatically the upward-facing side of the inverted upper LGA substrate 342. The upper LGA substrate can be constructed as a standard LGA substrate having lands or ball pads 344 as could be used in a standard CSP to interconnect the LGA to the product board via solder joints, or, alternatively, the lands or ball pads 344 can be covered by a solder mask. Where exposed these lands also serve as test access points for testing the packaged die. The substrate has the additional feature of bond fingers 346 arranged on the periphery that are used for wire bonding the LGA to the lower package substrate to establish z-interconnections. The z-interconnect wire bonding can be either forward or reverse bonding, depending on the thickness restrictions for the whole package structure. Forward bonding, as shown in the example of FIG. 2, provides loop heights typically greater than 100 microns and up to 300 microns; reverse bonding can provide a lower loop height, typically 75-100 microns, and can be used for thinner package modules.

The z-interconnect between the upper die (upper package) package and the lower die (lower package) is made by way of wire bonds connecting traces on the upward facing metal layer (the "lower" metal layer) of the top package substrate with traces on the upper metal layer of the bottom package substrate. At one end each wire bond is electrically connected to upward facing surfaces of pads (323 in FIG. 3A) on the upper metal layer of the inverted bottom package substrate (312 in FIG. 3A), and at the other end each wire bond is connected to surfaces of pads (346 in FIG. 3B) on the upward-facing ("lower") metal layer of the inverted top package substrate (342 in FIG. 3B). The wire bonds may be formed by any wire bonding technique, well known in the art, such as is described, for example, in U.S. Pat. No. 5,226,582, which is hereby incorporated by reference herein. The package-to-package z-interconnect wire bonds are shown by way of example in FIG. 2 as having been made by forming a bead or bump on the upper surface of a pad on the upper metal layer of the top substrate, and then drawing the wire downward toward and fusing it onto, a pad on the upper metal layer of the bottom substrate. As will be appreciated, the wire bonds can be made in the inverse direction, that is, by forming a bead or bump on the upper surface of a pad on the upper metal layer of the bottom substrate, and then drawing the wire upward toward and fusing it onto, a pad on the upper metal layer of the top substrate. Selection of a wire bonding strategy for the package-to-package z-interconnection will be determined according to the geometric arrangements of the margins of the stacked substrates and of the bonding surfaces on them.

The top LGA package may be either array molded and saw singulated (giving vertical walls at the edges, as shown for example in FIG. 2, or cavity molded and punch singulated. In either type, the top package has bond pads connected to the die (through vias to the die attach side of the substrate) and situated at the periphery of the package on the substrate surface opposite the surface on which the die is attached, that is, on the "lower" (upward-facing) side of the inverted top package substrate, as described in further detail above.

The structure according to the invention allows for pre-testing of the upper LGA package before assembly into the module, to permit rejection of nonconforming packages prior to assembly, and thereby to assure high final module test yields.

Once the z-interconnect wire bonds have been formed, a module encapsulation (27 in FIG. 2) is formed, to enclose and protect the z-interconnect wire bonds and to provide mechanical integrity to the completed module. Accordingly, the module includes a molded upper package within the module molding. As shown by way of example in FIG. 2, the module may itself be saw-singulated; alternatively, the module may be individually cavity molded rather than saw-singulated.

Solder balls 18 are then attached to the underside of the module, using standard materials and process. Solder ball attachment can be done prior to singulation of the modules, on the whole strip or array, using the same or similar tooling used for making standard CSPs. Then the modules are singulated from the strip or module using standard techniques, to form the modules having standard CSP formats.

As noted, the structure allows for stacking of a fully packaged and tested die onto another die in a standard CSP format. The top LGA containing one or more die can be tested to be "good" before stacking it in the MCM; LGA not testing as "good" are discarded prior to stacking, thus reducing waste of "good" materials and avoiding unproductive processing steps on materials that are not good.

For improved heat dissipation from the module, a heat spreader may be provided over the top package. The top heat spreader is formed of a thermally conductive material having at least the more central area of its upper surface exposed at the upper surface of the MCM to ambient for efficient heat exchange away from the MCM. The top heat spreader may be, for example, a sheet of metal (such as copper or aluminum) or of any of a variety of other thermally conductive materials, such as aluminum nitride. The heat spreader has a size and shape to substantially cover the module. The heat spreader can be made thicker in a central area over the top package to increase metal content, and thinner at the periphery so that it does not interfere with the z-interconnect wire bonds. If made thicker in a central area the heat spreader may be affixed to the upward facing surface of the top package; in such embodiments a thermally conductive (electrically nonconductive) adhesive is preferred. Or, a spacer may be placed over the upward facing surface of the package inboard of the wire bond sites, and the heat spreader may be affixed to the upper surface of the spacer. Alternately the heatspreader can be molded-in, resulting in a similar structure but without the adhesive; that is, the heat spreader may be dropped into the MCM encapsulant mold and affixed at the upper surface of the module during the molding material curing process. Heat dissipation can be further enhanced by use of a heat-conducting (electrically nonconductive) molding.

Figure 4:
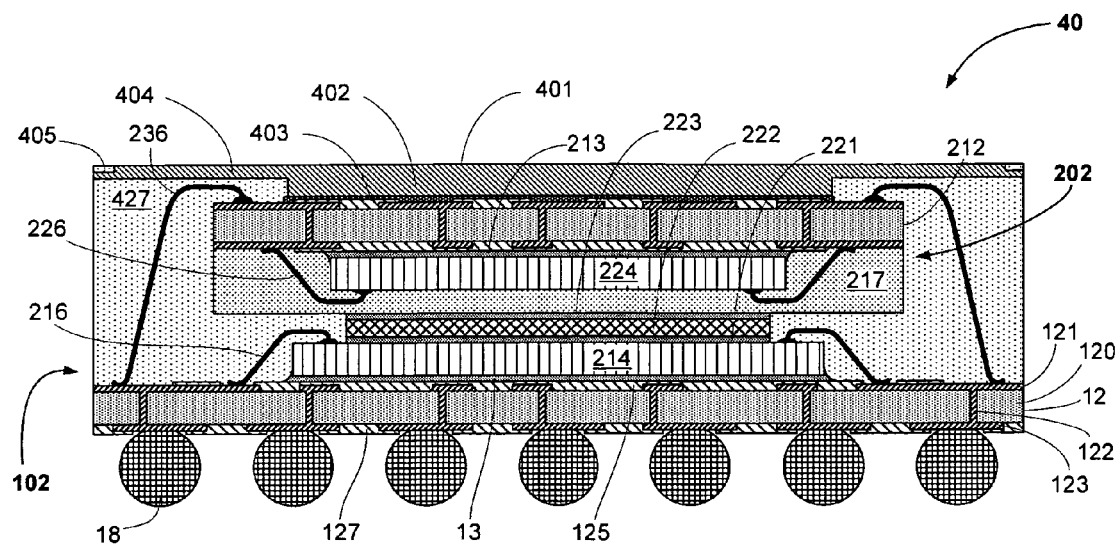
FIG. 4 is a diagrammatic sketch in a sectional view showing a multiple chip package according to an embodiment of the invention, having a lower BGA package with a spacer over a wire-bonded die, and an inverted LGA package stacked over the spacer on the lower package die, and having a heat spreader affixed onto the upward facing side of the upper package.

For example, a top heat spreader having a thicker central region can be affixed to the upward facing surface of the top package as shown diagrammatically in a sectional view at 40 in FIG. 4. The construction of the module here is generally similar to that of FIG. 2, and like features are identified by like reference numerals. The top heat spreader in the example of FIG. 4 is a generally planar piece of a thermally conductive material having at least the more central area of its planar upper surface 401 exposed to ambient for efficient heat exchange away from the module. The top heat spreader has a thicker central portion 402, inboard of the wire bond sites on the upward-facing surface of the top package 202, and the thicker portion is affixed to the upward facing side of the top package using an adhesive 403. A thinner more peripheral portion 404 may extend to the margin of the module, so that the upper surface 401 of the heat spreader constitutes substantially all the upper surface of the module. The thickness of the heat spreader may in some embodiments be in the range 0.2 to 0.6 mm, nominally 0.4 mm. The top heat spreader may be, for example, constructed of metal (such as copper, or aluminum). Where the top heat spreader is made of copper, the lower surface is preferably treated to have a black oxide, for improved adhesion to the attachment material beneath; the exposed upper surface may be treated to form a black oxide, or it may be provided with a matte nickel (plate) surface. The adhesive 403 may optionally be a thermally conductive adhesive, such as a thermally conductive epoxy, to provide improved heat dissipation; and the adhesive may be electrically nonconductive, in embodiments in which the upper package substrate has exposed electrical features on the upward facing ("lower") side. Usually the top heat spreader is affixed to the top package before the molding material is injected for the MCM encapsulation (MCM molding). The periphery of the top heat spreader may be encapsulated with the MCM molding material 427. The MCM molding 427 may optionally be thermally conductive (electrically nonconductive).

In the embodiment of FIG. 4 a step like re-entrant feature 405 is provided on the periphery of the heat spreader to allow for better mechanical integrity of the structure with less delamination from the molding compound, and to eliminate "mold flash" on top of the heatspreader. Mold flash is usually caused by the flow of the molding compound on the top of the heatspreader in the mold cavity during the molding process. The filler of the molding compound accumulates on the step like feature of the heatspreader and forms a dam that prevents the epoxy flow to the top of the heatspreader. Mold flash in detrimental to heat conduction and cosmetically unacceptable. The heatspreader as shown in this example has the additional feature of being thicker over the LGA and thinner over the wire bonds. This allows for attachment of the heat spreader onto the upper package using a thinner adhesive. A thinner adhesive is advantageous because the adhesive typically has lower thermal conductivity compared to metal and therefore increases thermal dissipation.

The heat spreader may be made, for example, by partially etching a sheet of the heat spreader material to provide the various thicknesses (peripheral portion and/or re-entrant feature) and by fully etching to produce the edges. A number of heat spreaders may be made in an array on a sheet or strip of heat spreader material, and the individual heat spreaders may be separated subsequently.

Figure 5:
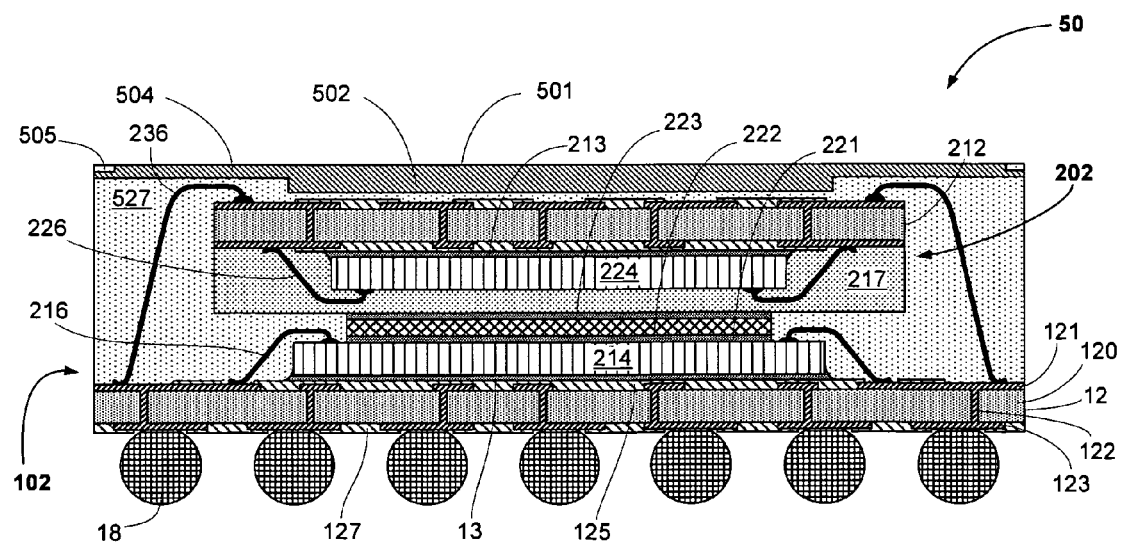
FIG. 5 is a diagrammatic sketch in a sectional view showing a multiple chip package according to an embodiment of the invention, having a lower BGA package with a spacer over a wire-bonded die, and an inverted LGA package stacked over the spacer on the lower package die, and having a heat spreader molded into the module over the upper package.

As a further alternative, an MCM as in FIG. 2 can be provided with a planar heat spreader that is not attached to the upper surface of the top package molding, as shown for example generally at 50 in FIG. 5. In such embodiments, as in the embodiment of FIG. 4, the top heat spreader can be a generally planar piece of a thermally conductive material such as, for example, a sheet of metal (such as copper or aluminum), and at least the more central area of the upper surface 501 of the planar heat spreader is exposed to ambient for efficient heat exchange away from the MCM. Here, the heat spreader may (as in FIG. 5) or may not have a thicker central portion 502 inboard of the wire bond sites on the upper package 202. Alternatively, the space between the lower surface of the simple planar heat spreader and the upper surface of the top package may be filled by a thin layer of the MCM molding, and such a simple planar heat spreader may be affixed to the MCM encapsulant during the molding material curing process. Where an unattached heat spreader has a thicker central portion 502 a thinner more peripheral portion 504 may extend to the margin of the module, so that the upper surface 501 of the heat spreader constitutes substantially all the upper surface of the module. The periphery of an unattached top heat spreader, whether it is thicker in the center or has a simple planar configuration, can be encapsulated with the MCM molding material 527, as in the attached planar heat spreader of FIG. 4, and may be provided with a step-like re-entrant feature 505 on the periphery to allow for better mechanical integrity of the structure with less delamination from the molding compound 527.

An MCM structure having a heat spreader can provide significant thermal enhancement and may provide electrical shielding over the module, which can be critical, for example, to MCMs that combine RF and digital chips.

Figure 6:
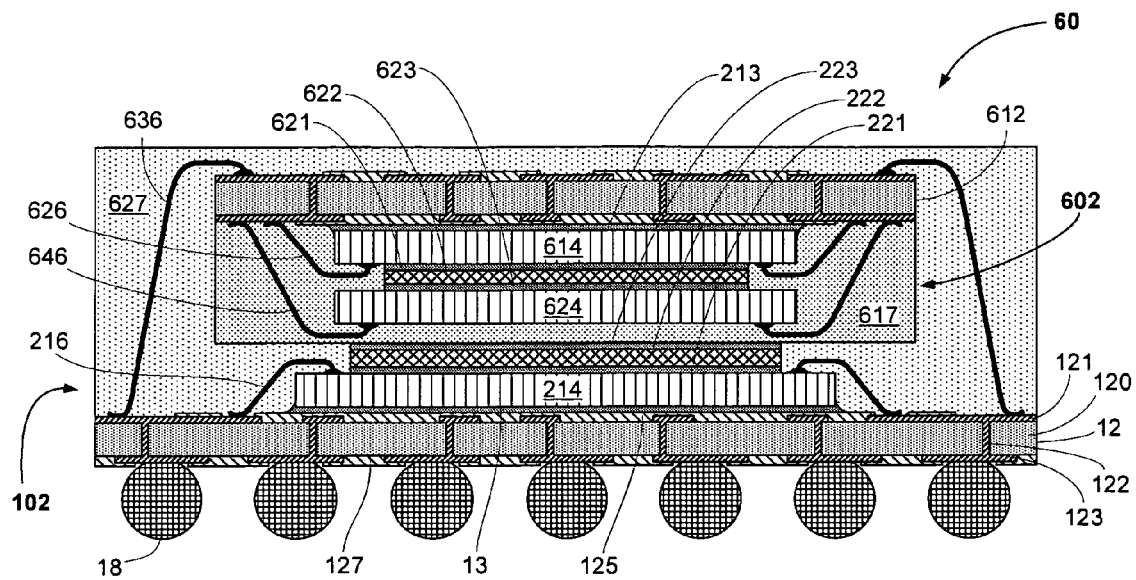
FIG. 6 is a diagrammatic sketch in a sectional view showing a multiple chip package according to an embodiment of the invention, having a lower BGA package with a spacer over the a wire-bonded die, and an inverted LGA two-die stacked die package stacked over the spacer on the lower package die.

According to the invention the top package can be a stacked die package, as shown by way of example generally at 60 in FIG. 6. The construction of the module here is generally similar to that of FIG. 2, and like features are identified by like reference numerals. Particularly, the module 60 contains three die 214, 614, 624, in which in effect an inverted LGA package 602 having stacked die 614, 624 is stacked on a die 214 in a lower package 102. The lower die 214 is mounted on a substrate 12 in substantially the same manner as described above with reference to FIG. 2 by way of example and, as in the embodiment of FIG. 2, the lower die and its substrate may be supplied just as for a conventional package, but with no molding. That is, in the example shown here, the lower die 214 is mounted active side upward using a die attach epoxy 13 onto an upward-facing side of a BGA substrate 12, and the die is wire-bonded to wire bond sites on the upper metal layer of the BGA substrate. Solder balls 18 are mounted onto the downward facing side of the lower substrate to provide for second level interconnection with underlying circuitry as, for example, a motherboard (not shown). Thus the lower die and the lower substrate on which it is mounted can constitute a standard BGA package. Multiple such packages can be made in a strip or array.

As in the embodiment of FIG. 2, in module 60 the spacer 222 is affixed using an adhesive 221 onto the upward facing (active) surface of the lower die 214. The spacer may be a solid piece, as shown here, which may be glass or a dummy silicon chip; or spacing may be provided by a spacer adhesive. As in the conventional stacked die package the spacer must be thick enough to provide sufficient standoff to accommodate the loop height of the bottom package wire bonds 216, and— where a solid spacer such as a dummy die is employed—the footprint of the spacer must be small enough that it does not contact the wire bonds at or near the die pads.

The inverted LGA package 602 includes stacked first and second die 614, 624 separated by a spacer 622. The stacked die package 602 can be provided as a conventional stacked die package, as described generally with reference to FIG. 1. Referring to FIG. 6, first die 614 is mounted on a substrate 612 using a die attach adhesive 613, and the die 614 is electrically connected to the substrate 612 by wire bonds 626.

Any of various substrate types may be used, including for example: a laminate with 2-6 metal layers, or a build up substrate with 4-8 metal layers, or a flexible polyimide tape with 1-2 metal layers, or a ceramic multilayer substrate. The substrate 612 shown by way of example in FIG. 6 has two metal layers on opposite sides of a dielectric, each metal layer being patterned to provide appropriate circuitry and connected through the dielectric by way of vias.

The first die 614 is conventionally attached to a surface of the substrate using an adhesive, typically referred to as the die attach epoxy, shown at 213 in FIG. 6 and, in the configuration in FIG. 6, the surface of the substrate onto which the die is attached may be referred to as the "upper" surface, and the metal layer on that surface may be referred to as the "upper" metal layer, although the die attach surface need not have any particular orientation in use and, particularly, in the module according to the invention the stacked die package 602 is inverted, so that the die attach ("upper") surface of the substrate 612 is downward-facing. The spacer 622 is affixed to the active surface of the first die 614 by an adhesive 621 and the second die 624 is affixed to the opposite surface of the spacer 622 by an adhesive 623.

In the stacked die package 602 of FIG. 6 the die are wire bonded onto wire bond sites on the upper (downward-facing when inverted in the module) metal layer of the substrate to establish electrical connections; wire bonds 626 connect the first die 614 to the substrate and wire bonds 646 connect the second die 624 to the substrate. The die 614 and 624 and the wire bonds 626 and 646 are molded (typically by array molding and saw singulation, to make a standard "chip scale package") with a molding compound 617 that provides protection from ambient and from mechanical stress to facilitate handling operations, and provides a surface for marking for identification.

As will be appreciated, the wire bonds 626 in the stacked die package 602 have a characteristic "loop height", which (together with a loop height tolerance) is a parameter of the wire-bonding process, and sufficient spacing must be provided between the second and the first die 624, 614 to avoid damage to the wire bonds by impact with the second die. Accordingly, the spacer 622 is provided as a pedestal to support the second die 624 over the first die 614. The spacer is made narrow enough so that it does not impact the wire bonds at its edges, and thick enough to provide spacing sufficient to hold the second die above the wire loops; that is, the spacer itself does not impact the wires, and it provides sufficient distance between the first and second die so that the downward-facing side of the second die does not damage the wire bonds 626.

The inverted package 602 is electrically interconnected ("z-interconnect") to the bottom substrate 102 by wire bonds 636, and the top package 602, the bottom die 214 and the spacer 222, the wires 236 and 216, and the die attach surface of the substrate 12 are encapsulated with a module encapsulant 627.

One or both of the spacers 222 and 622 can be a solid material, such as a dummy silicon die or glass; or one or both of them can be an adhesive spacer, as described above with reference to FIG. 2.

Solder balls 18 are reflowed onto bonding pads on the lower metal layer of the BGA lower package substrate (which constitutes the module substrate in the completed module) to provide interconnection to the motherboard (not shown) of a final product, such as a computer, for example, or a mobile communications device. Solder masks 125, 127 are patterned over the metal layers 121, 123 to expose the underlying metal at bonding sites for electrical connection, for example the wire bond sites and bonding pads for bonding the wire bonds 636, 216 and solder balls 18.

Figure 7:
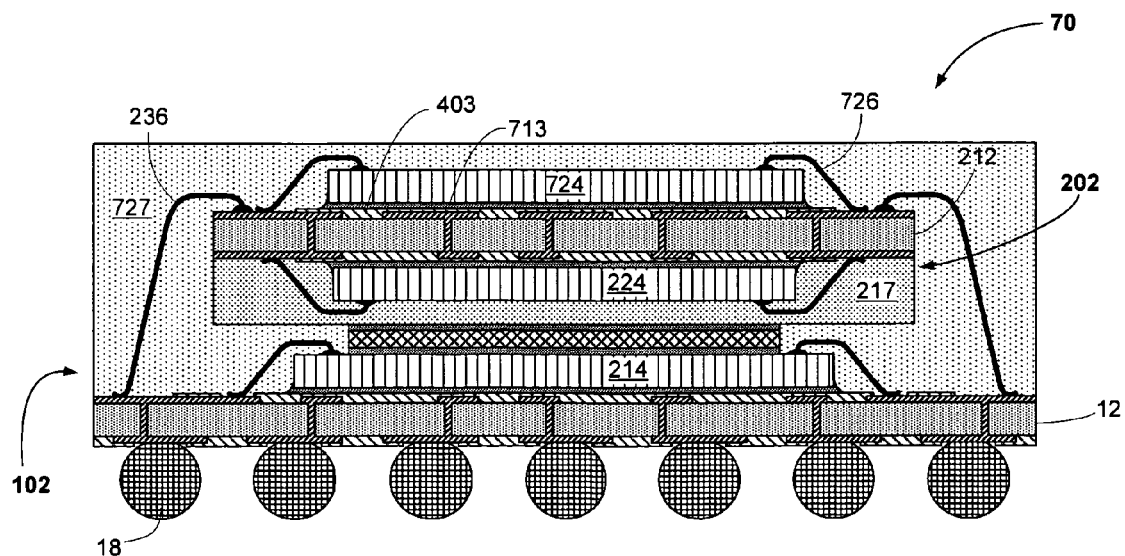
FIG. 7 is a diagrammatic sketch in a sectional view showing a multiple chip package according to an embodiment of the invention, having a lower BGA package with a spacer over a wire-bonded die, and an inverted LGA package stacked over the spacer on the lower package die, and having a die mounted upon the inverted LGA package and connected by wire bonding to the LGA package and the lower BGA package substrate.
Figure 8:
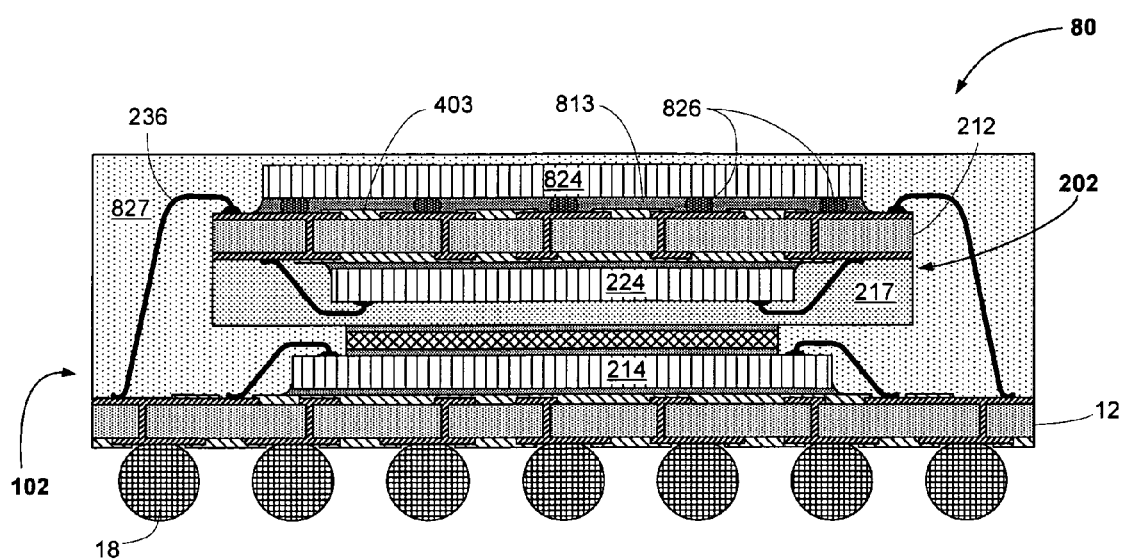
FIG. 8 is a diagrammatic sketch in a sectional view showing a multiple chip package according to an embodiment of the invention, having a lower BGA package with a spacer over a wire-bonded die, and an inverted LGA package stacked over the spacer on the lower package die, and having a flip chip die mounted upon the inverted LGA package.

In some embodiments of the invention, additional die may be stacked over the second (upper) inverted package, as shown in FIGS. 7 and 8.

FIG. 7 shows an example of a multiple chip module according to the invention generally at 70, in which an inverted LGA package 202 is stacked over a die 214 in a BGA package 102, separated by a spacer, generally as described above with reference to FIG. 2, and in which an additional die 724 is mounted upon and is wire bonded to the upward-facing side of the LGA package substrate 212. Certain features of the embodiment of FIG. 7 correspond to features in FIG. 2, and like features are identified by like reference numerals. The additional die 724 is affixed to the substrate 212 surface using an adhesive 713, and is electrically connected by wire bonds 726 to traces on the upward-facing side of the substrate 212. The exposed upward-facing side of the lower package substrate 12 and the parts of the module mounted over it are encapsulated by a molding 727. Two or more such additional die may be stacked over the second (upper) inverted package, adjacent ones separated by spacers as may be required according to the dimensions of the respective stacked die.

FIG. 8 shows an example of a multiple chip module according to the invention generally at 80, in which an inverted LGA package 202 is stacked over a die 214 in a BGA package 102, separated by a spacer, generally as described above with reference to FIG. 2, and in which an additional die 824 is mounted upon the upward-facing side of the LGA package substrate 212 in flip-chip fashion. Certain features of the embodiment of FIG. 8 correspond to features in FIG. 2 (and FIG. 8), and like features are identified by like reference numerals. The additional die 824 is interconnected to traces on the upward-facing side of the substrate 212 by way of bumps (such as gold bumps) or balls (such as solder balls) 826. An underfill 813 fills the space between the downward-facing (active) side of the die 824 and the upward-facing side of the substrate 212 to secure the flip chip attachment and to protect the electronic features of the die and the substrate surface and the bumps or balls. The exposed upward-facing side of the lower package substrate 12 and the parts of the module mounted over it are encapsulated by a molding 827.

Figure 9:
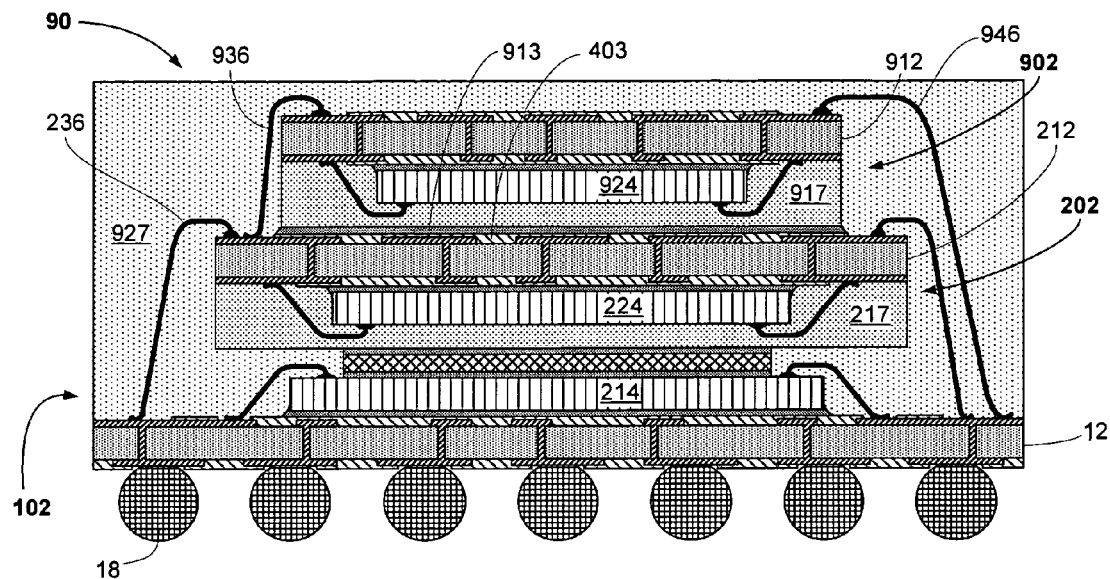
FIG. 9 is a diagrammatic sketch in a sectional view showing a multiple chip package according to an embodiment of the invention, having a lower BGA package with a spacer over a wire-bonded die, and a first inverted LGA package stacked over the spacer on the lower die, and having an additional inverted LGA package mounted upon the first inverted LGA package and connected by wire bonding to the first inverted LGA package and the lower BGA package substrate.
Figure 10:
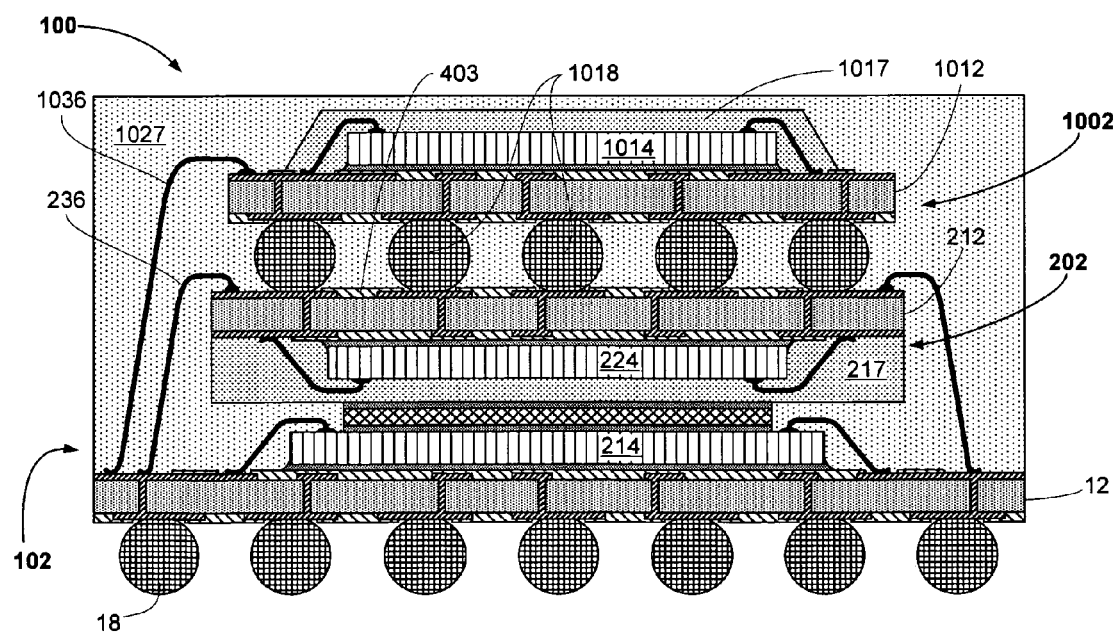
FIG. 10 is a diagrammatic sketch in a sectional view showing a multiple chip package according to an embodiment of the invention, having a lower BGA package with a spacer over a wire-bonded die, and a first inverted LGA package stacked over the spacer on the lower package die, and having an additional BGA package mounted upon the first inverted LGA package and connected by wire bonding to the lower BGA package substrate.

In some embodiments of the invention, additional die may be stacked over the second (upper) inverted package, as shown in FIGS. 9 and 10.

FIG. 9 shows an example of a multiple chip module according to the invention generally at 90, in which an inverted LGA package 202 is stacked over a die 214 in a BGA package 102, separated by a spacer, generally as described above with reference to FIG. 2, and in which an additional inverted LGA package 902 is inverted and mounted upon the upward-facing side of the LGA package substrate 212. Certain features of the embodiment of FIG. 9 correspond to features in FIG. 2, and like features are identified by like reference numerals. The additional package 902 in this example is an LGA package; it includes a die 924 mounted on a substrate 912 using an adhesive; the die 924 is electrically connected to the substrate 912 by wire bonds, and the die 924 and the downward-facing (upper) surface of the substrate 912 and the wire bonds are encapsulated in a molding 927. The additional LGA package 902 is electrically interconnected (z-interconnect) to the second (upper) package 202 substrate 212 by wire bonds 936, or is connected to the first (lower) package 102 substrate 12 by wire bonds 946; or, the additional LGA package 902 may be electrically interconnected to both the second package substrate and the first package substrate, as shown for example in the FIG.

FIG. 10 shows an example of a multiple chip module according to the invention generally at 100, in which an inverted LGA package 202 is stacked over a die 214 in a first BGA package 102, separated by a spacer, generally as described above with reference to FIG. 2, and in which an additional BGA package 1002 is mounted upon the upward-facing side of the LGA package substrate 212. Certain features of the embodiment of FIG. 10 correspond to features in FIG. 2 (and FIG. 9), and like features are identified by like reference numerals. The additional package 1002 in this example is a BGA package; it includes a die 1014 mounted on a substrate 1012 using an adhesive; the die 1014 is electrically connected to the substrate 1012 by solder balls 1018, reflowed onto ball pads in the patterned metal layer on the lower side of the substrate 1012, and the die 1014 and the wire bonds connecting it to the substrate 1012 are encapsulated in a molding 1017. The additional BGA package 1002 is electrically interconnected (z-interconnect) to the first (lower) package 102 substrate 12 by wire bonds 1036.

Various semiconductor chips (die) can be employed in various combinations at the various places in the multiple chip modules according to the invention. For example, referring to FIG. 2, in one exemplary embodiment of the MCM according to the invention, the lower package can have a single die 214 which can be a processor, such as an application-specific integrated chip ("ASIC"), or a digital signal processor ("DSP"), or a graphics processor ("GPU"), or a central processing unit ("CPU"). In such modules, the upper package may typically be, for example, a memory package including one or more die 224 constituting a FLASH memory die (NOR or NAND type), or a SRAM, or SDARM, or MRAM, or DRAM, or DDRAM die, for example; or the upper package may be a stacked die memory package (constructed as shown for example in FIG. 6) including a combination of one or more types of memory die 614, 624.

Or, for example, referring again to FIG. 2 and FIG. 12 in another exemplary embodiment of the MCM according to the invention, the module can be a memory module, in which the lower package can have a single die 214 which can be a memory die such as a DRAM die, or a stack of die 214, 1214 which can include one or more memory types. In such embodiments the inverted upper package can have one or more die (224 in FIG. 2, 614, 624 in FIG. 6) of one or more memory types, typically the upper package is a FLASH memory package or a package having a combination of FLASH and other memory types. According to the invention, an advantage is realized in combining memory types, because different memory types are typically supplied by different vendors, and are tested using different testing methods and criteria. Where, for example, the lower package die is a DRAM die, and is supplied as a "known good die", its performance parameters change when the die is mounted onto the substrate, and a lower package including such a die should preferably be retested before it is used on a multiple chip module having the DRAM die together with other memory (or other type) die. Such testing is facilitated according to the invention.

In modules as illustrated for example in FIG. 8, the lower package die 214 may be a processor, such as a CPU or a DSP or a GPU, for example; and the inverted package die 224 and the additional die 824 may be memory die; for example, one of the die 224 and 824 may be a very fast memory device (such as a DDR or DRAM die), and the other may be a nonvolatile memory device (such as a FLASH memory die).

In modules as illustrated for example in FIG. 9, the additional package 902 can be a BCC or a QFN or a tape-substrate based LGA package. These all are referred to generally herein as "LGA" packages, although a conventional LGA package usually includes an area array as well as a peripheral array of interconnection pads (as illustrated for example in FIG. 3B and conventional BCC or QFN packages may have only peripheral pads for interconnection.

An advantage of modules as illustrated for example in FIG. 10 is that the additional BGA package 1002 can be a conventional BGA package, such as an off-the-shelf BGA memory package. This can readily and flexibly be incorporated into the module according to the invention as the particular end application may require.

Figure 11:
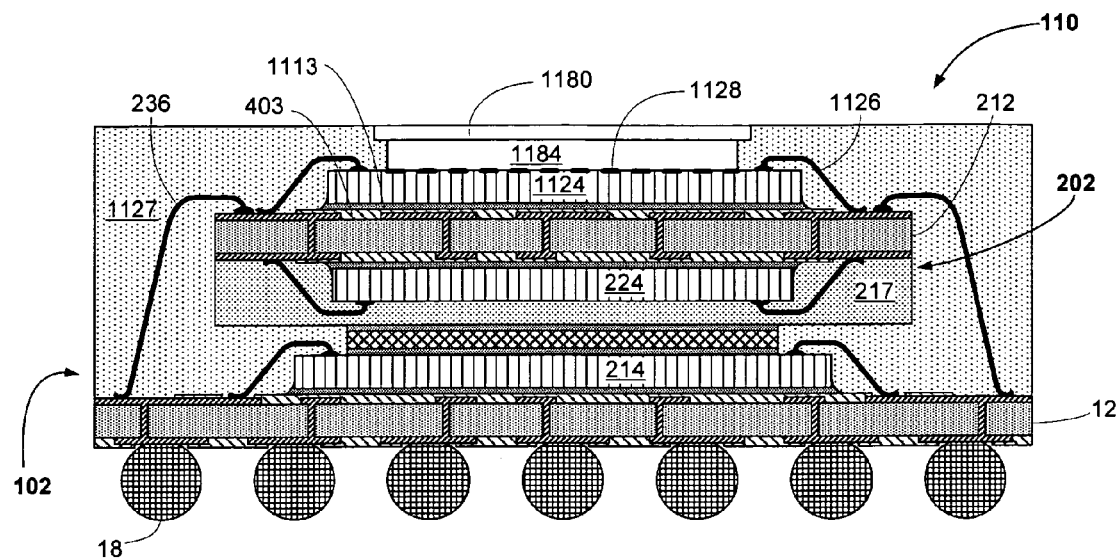
FIG. 11 is an example of a multiple chip module with an inverted LGA package stacked over a die and an additional die mounted upon the upward-facing side of the LGA package substrate.

In some embodiments of the invention, an additional stacked over the second (upper) inverted package may be a photosensor die (such as an imaging die), as shown in FIG. 11.

FIG. 11 shows an example of a multiple chip module according to the invention generally at 110, in which an inverted LGA package 202 is stacked over a die 214 in a BGA package 102, separated by a spacer, generally as described above with reference to FIG. 2, and in which an additional die 1184, which is for example a CMOS sensor device, is mounted upon the upward-facing side of the LGA package substrate 212. Certain features of the embodiment of FIG. 11 correspond to features in FIG. 2, and like features are identified by like reference numerals. The additional die 1124 in this example is mounted on the upward-facing side of the substrate 212 using an adhesive 1113; the die 1124 is electrically connected to the substrate 212 by wire bonds 1126. A molding 1127 encapsulates a marginal portion of the die 1124 and the wire bonds 1126, the inverted package 202 and the exposed portions of the die 214 and the spacer between the die 214 and the package 202, and the wire bonds between the die 214 and the substrate 12, and the z-interconnect wire bonds 236. A photosensitive area 1128 of the active surface of the additional die 1124 is not covered by the molding 1127. A transparent window 1180, which may be glass or quartz, or a transparent polymer, for example, spans the uncovered photosensitive portion 1128 of the die 1124, enclosing (and substantially sealing) a space 1184 over the photosensitive portion of the die, which space may be filled with a gas or gas mixture such as dry air, or nitrogen. An optical element such as a lens (not shown in the FIG.) may be provided to direct light, or an image, through the window 1124 and the space 1184 onto the photosensitive area 1128 of the die 1124. In such a package 110, the inverted package 202 may be, for example, a memory package, and the lower die 214 may be a processor such as a graphics processor (GPU), for example. In such an embodiment the module 110 constitutes the core of a camera, suitable for use in a portable device such as a mobile communications device.

Figure 12:
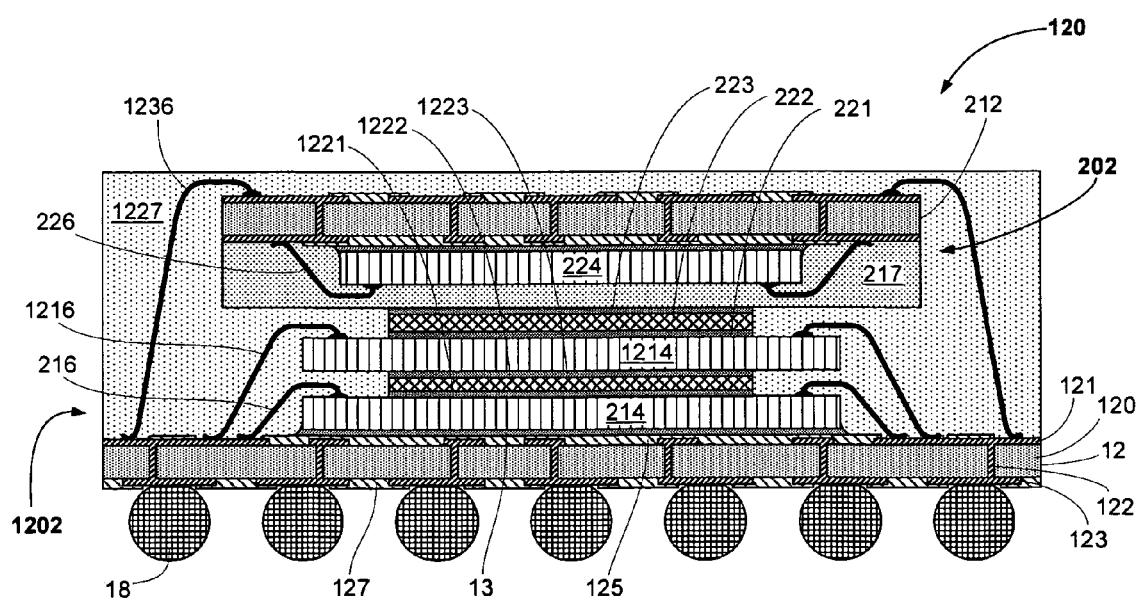
FIG. 12 is a diagrammatic sketch in a sectional view showing a multiple chip package according to an embodiment of the invention, having a lower two-die stacked die BGA package, and a first inverted LGA package stacked over the lower package die.

In other embodiments of the invention the lower package may include two or more die, which may be stacked one over another, as shown in FIG. 12, for example. Referring to FIG. 12, a die 214 is shown mounted on a substrate 12 and interconnected by wire bonds 216 to traces on the substrate 12 as described generally with reference to FIG. 2. A second die 1214 is stacked over the die 214 and is interconnected by wire bonds 1216 to the substrate 12. A spacer 1222 interposed between the die 1214 and 214 to provide clearance for the loop height of the wires 216, as described generally with reference to FIG. 2. The spacer 1222 is affixed to the upward-facing surface of the die 214 by an adhesive 1221, and the die 1214 is affixed to the upward-facing surface of the spacer 1222 by an adhesive 1223. An inverted package 202 is mounted over the die 1214 and is separated therefrom by a spacer 222. The spacer 222 is affixed to the upward-facing surface of the die 1214 by an adhesive 221, and the package 202 is affixed to the upward-facing surface of the spacer 222 by an adhesive 223. The inverted package 202 is interconnected by wire bonds 1236 to the substrate 12, and the module is encapsulated in a molding 1227.

Figure 13:
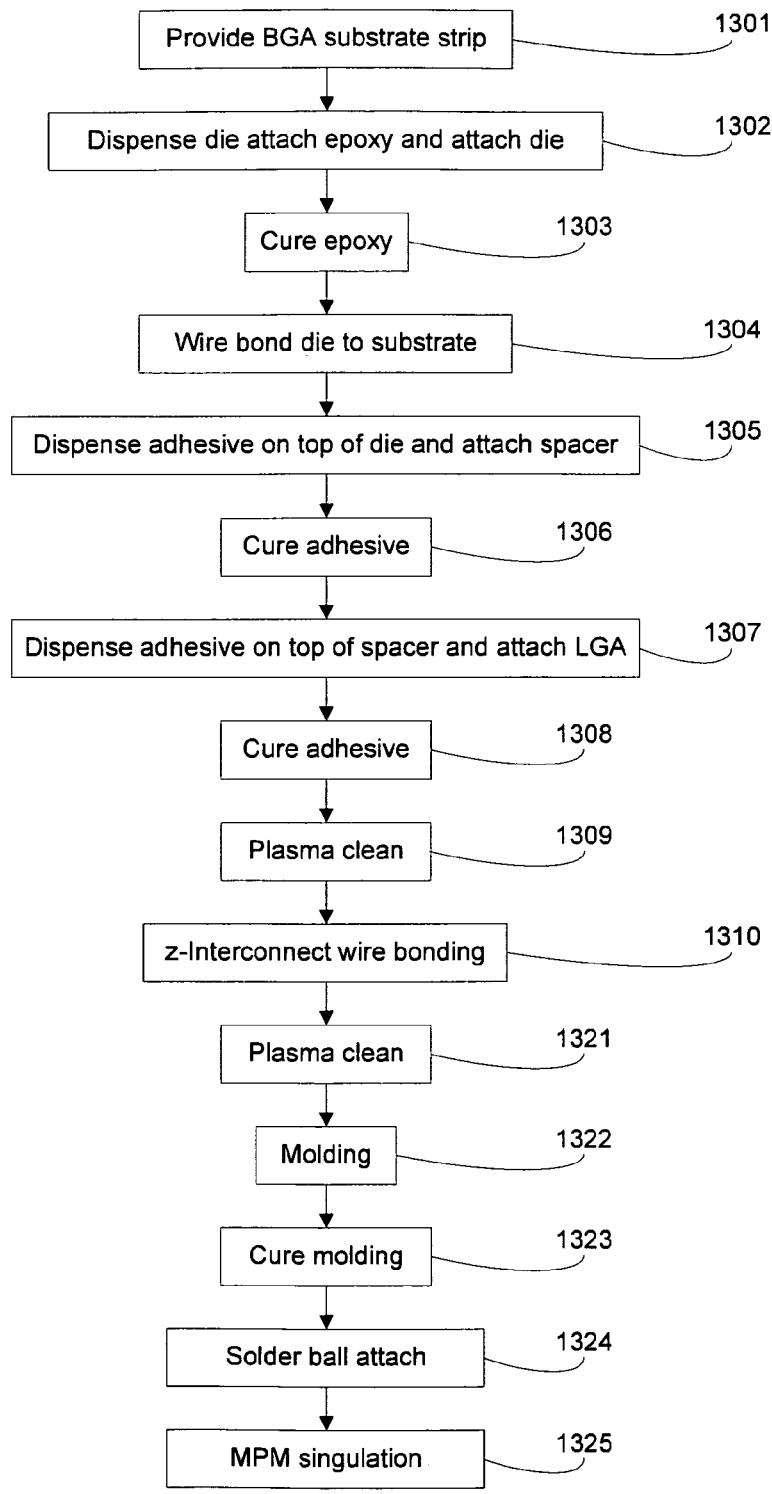
FIG. 13 is a flow diagram showing process steps for making a multiple chip package module according to one embodiment of the invention.

FIG. 13 is a flow diagram showing steps in an assembly process according to the invention for making a module as in FIG. 2. The lower die is attached to and wire bonded to the lower substrate in steps 1301, 1302, 1303 and 1304. The spacer is affixed over the lower die in steps 1305 and 1306. The inverted upper package is affixed over the spacer in steps 1307 and 1308. A plasma clean step 1309 is performed to prepare the wire bond sites for z-interconnect wire bonding 1310, followed by a further plasma clean 1321 to prepare all the surfaces for good adhesion of the molding. Molding is then introduced and cured, in steps 1322 and 1323. Then the solder balls are attached, 1324, and the modules are singulated from the strip, 1325.

Figure 14:
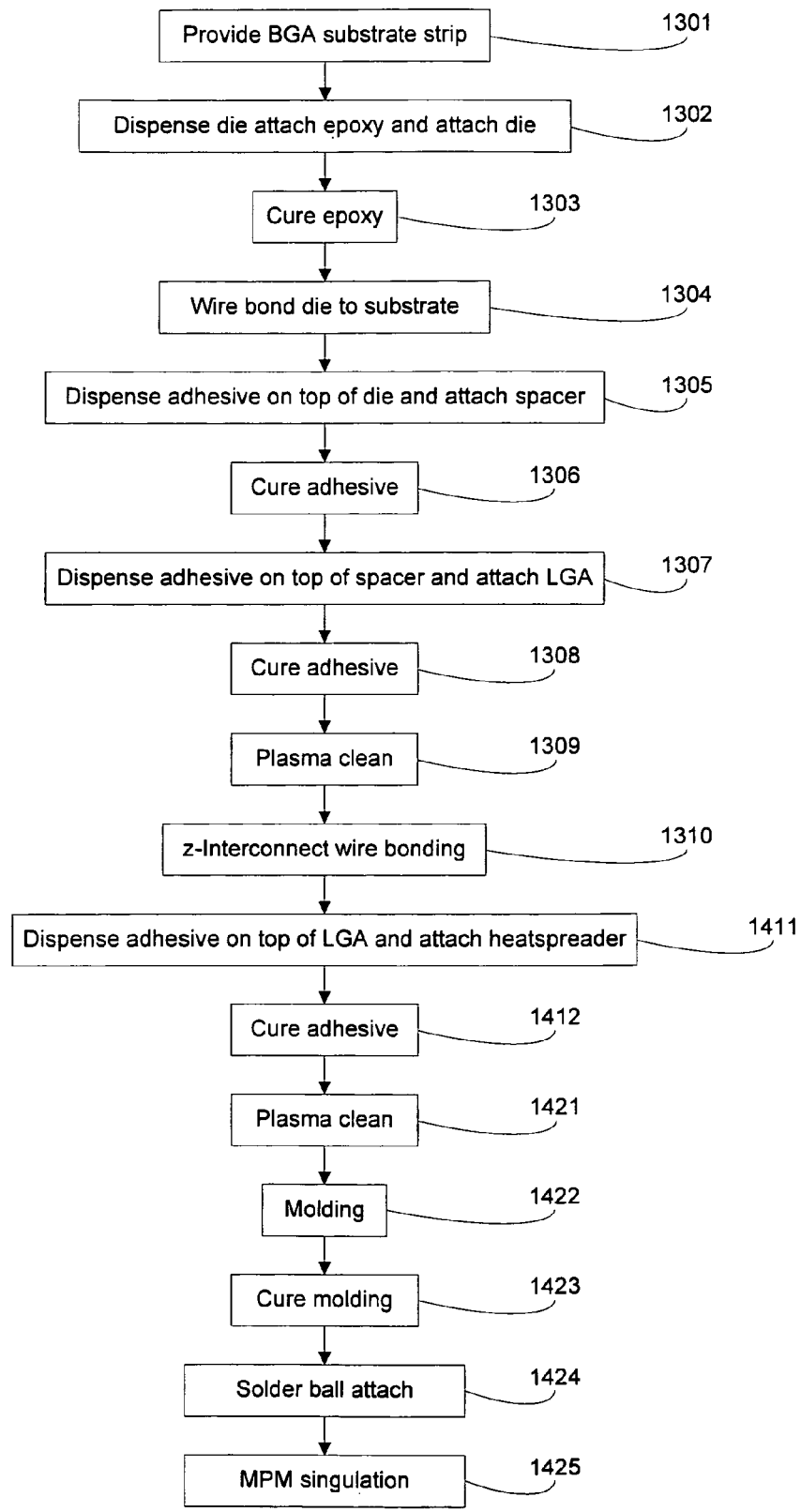
FIG. 14 is a flow diagram showing process steps for making a multiple chip package module according to another embodiment of the invention.

FIG. 14 is a flow diagram showing steps in an assembly process according to the invention for making a module as in FIG. 4, having a heat spreader affixed onto the upward facing side of the upper package. The process up to the point of completion of the z-interconnections, steps 1301 through 1310, is similar to the process of FIG. 13. Here, following z-interconnection, an adhesive is dispensed on the upward facing side of the upper LGA package, and the heatspreader is placed onto the adhesive, step 1411, and then the adhesive is cured, step 1412. There follows a further plasma clean 1421 to prepare all the surfaces for good adhesion of the molding. Molding is then introduced and cured, in steps 1422 and 1423. Then the solder balls are attached, 1424, and the modules are singulated from the strip, 1425.

Figure 15:
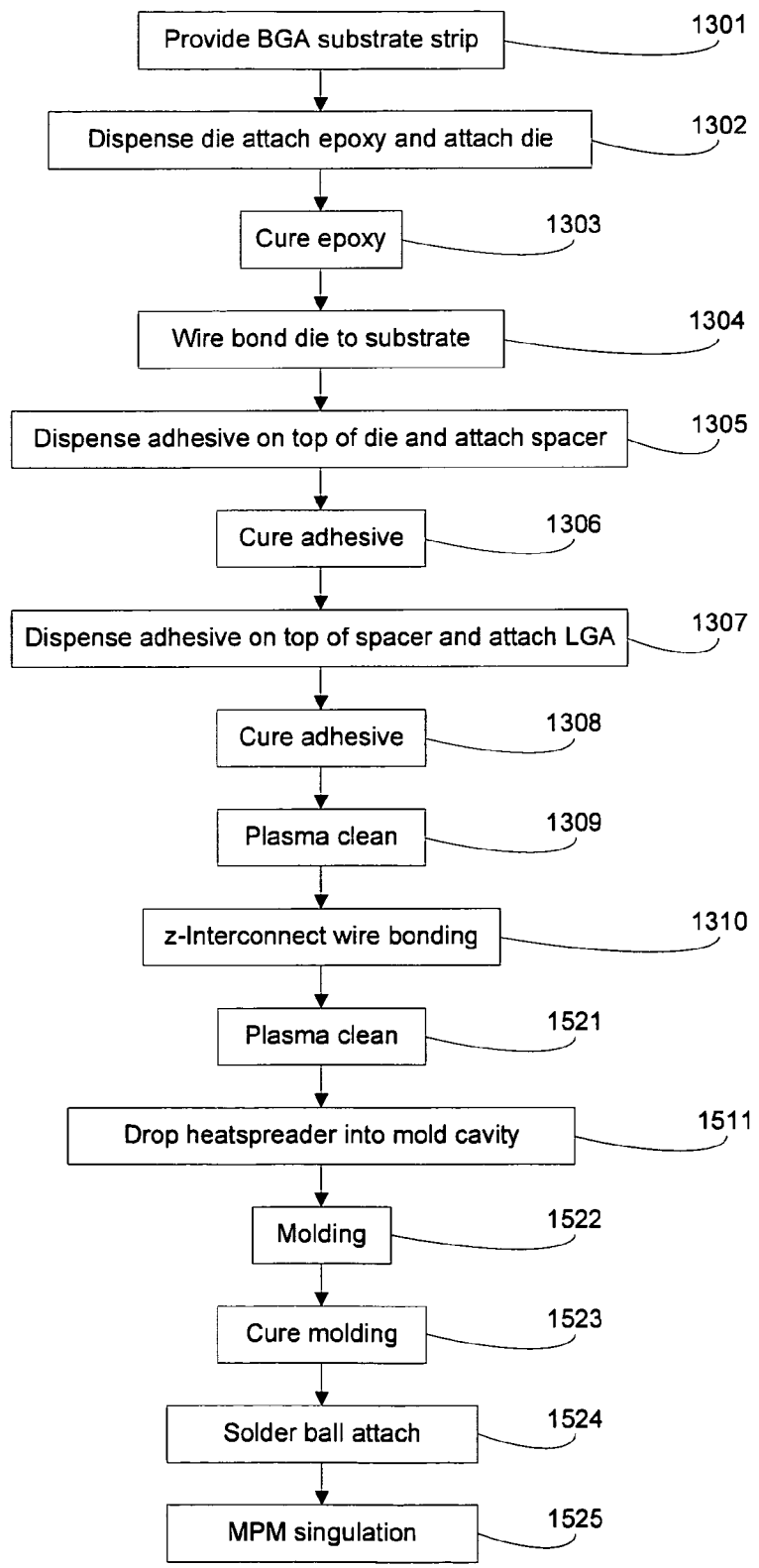
FIG. 15 is a flow diagram showing process steps for making a multiple chip package module according to another embodiment of the invention.

FIG. 15 is a flow diagram showing steps in an assembly process according to the invention for making a module as in FIG. 5, having a heat spreader embedded in the molding over the upper package. The process up to the point of completion of the z-interconnections, steps 1301 through 1310, is similar to the process of FIG. 13 or FIG. 14. Here, following z-interconnection, the heatspreader is dropped into the mold cavity, step 1511. The stack is placed over the heatspreader in the cavity and molding is then introduced and cured, in steps 1522 and 1523. Then the solder balls are attached, 1524, and the modules are singulated from the strip, 1525.

The methods employ established manufacturing infrastructure, and can provide lower cost of manufacture as compared to alternative stacked package structures that require new methods and tools.

Modules made according to the invention can have lower cost than comparable stacked die packages (that is, stacked die packages containing similar sets of die), owing to the fact that according to the invention the upper die can be tested in their respective upper packages prior to assembly, and only those packages tested as "good" are selected for further processing. Materials and processing waste are accordingly reduced.

Also, modules according to the invention can be more reliable than comparable stacked die packages, because the upper packages employed in the invention can be subjected to more rigorous reliability tests than can the stacked die package; particularly, a memory "burn-in" test can be performed where the upper package contains a memory die.

Also, packaged die can be more readily sourced from different suppliers than bare die; even more difficult to obtain, and significantly more expensive, are Known Good Die.

The use of wire bonding for the z-interconnect in the modules of the invention provides an additional advantage over stacked package technologies that employ other z-interconnects between stacked packages. Wire bonding is well established in the industry and has the lowest cost structure. Because the wire bond process is programmable it provides has high flexibility in response to design changes; and it allows for lower cost substrates and assembly tooling. The fine pitch nature of wire bonding, currently at 50 micron pitch, allows a high number of interconnects between the LGA and the CSP substrate. That capability often translates into high performance and design flexibility.

The spacer adds further flexibility to the design. The spacer technology allows for a significantly larger LGA to be assembled on top of a smaller die, and this can be of high value particularly in applications where the lower die is a memory, that usually is a larger die. Where the lower die is a processor with large I/O running at high frequency, the die usually is smaller and must be on the bottom to insure short wire lengths, which is very desirable for their low inductance that allows for high electrical performance.

All patents and patent applications referred to above are hereby incorporated by reference herein.

Other embodiments are within the following claims. For example, one or more of the packages in the multiple chip module may be a short range radio package, such as a so-called "Bluetooth" package, which may include one or more radio frequency chips and one or more passive devices, providing short range wireless interconnection for the functionality of the various devices in the multiple chip module.

What is claimed is:

1. A multiple chip module comprising: a substrate; a die mounted onto the substrate; a wire connected to the die and the substrate; a spacer mounted onto the die; a package stacked on the spacer with a surface of a molding of the package affixed to a surface of the spacer opposite the die, the package overlying and directly over the wire and having a top package substrate in direct contact with a surface of the molding opposite the spacer; and a wire bond attached directly to the substrate and an upward facing side of the top package substrate.

2. The module of claim 1, comprising a plurality of die attached to the substrate.

3. A multiple chip module comprising: a substrate; a die attached to a substrate; a wire connected to the die and the substrate; a spacer mounted on the die; and a package stacked on the spacer with a surface of a molding of the package affixed to a surface of the spacer opposite the die by an adhesive, the package overlying and directly over the wire and having a top package substrate in direct contact with a surface of the molding opposite the spacer; and a wire bond attached directly to the substrate and an upward facing side of the top package substrate.

4. A multiple chip module comprising: a BGA substrate; a die attached to the BGA substrate; a wire connected to the die and the BGA substrate, a spacer mounted on the die; and an inverted package stacked on the spacer with a surface of a molding of the inverted package affixed to a surface of the spacer opposite the die, the inverted package is overlying and directly over the wire and includes an inverted package substrate in direct contact with a surface of the molding opposite the spacer; and a wire bond attached directly to the BGA substrate and an upward facing side of the inverted package substrate.

5. The multi-chip module of claim 4 wherein the package is an LGA package.

6. The multi-chip module of claim 4 wherein the package is a saw-singulated package.

7. The multi-chip module of claim 4 wherein the package is a chip scale package.

8. The multi-chip module of claim 4 wherein the package has a tape-based package substrate.

9. The multi-chip module of claim 4 wherein the package is a bump chip carrier package.

10. The module of claim 4 comprising a plurality of die attached to said BGA substrate.

11. The module of claim 4, comprising a plurality of stacked die attached to said BGA substrate, and wherein the inverted package is mounted over an uppermost one of the stacked die.

12. The module of claim 4, comprising a flip chip die bonded to the BGA substrate.

13. The module of claim 4 wherein the inverted package includes a package substrate of the inverted package; and a flip chip die bonded to the package substrate.

14. The module of claim 4, further comprising a heat spreader over the package.

15. The module of claim 4, comprising a laminate substrate.

16. The module of claim 4, comprising a build-up substrate.

17. The module of claim 4, comprising a flexible substrate.

18. The module of claim 4, comprising a ceramic substrate.

19. The module of claim 4, further comprising an additional package mounted over the inverted package.

20. The module of claim 19 wherein the additional package is wire bonded to the inverted package substrate.

21. The module of claim 19 wherein the additional package is wire bonded to the BGA substrate.

22. The module of claim 4, further comprising an additional die mounted over the inverted package.

23. The module of claim 22 wherein the additional die is wire-bonded to the upper substrate.

24. The module of claim 22 wherein the additional die is wire-bonded to the BGA substrate.

25. The module of claim 4, further comprising a heat spreader.

26. The module of claim 4 further comprising a heat spreader affixed to an upward facing surface of a topmost package.

27. The module of claim 4 further comprising an additional die on the inverted package; and a heat spreader affixed to an upward facing surface of the additional die.

28. The module of claim 4 wherein the inverted package is the uppermost package in the module, and further comprising a heat spreader affixed to an upward facing side of the inverted package.

29. The module of claim 4 further comprising a heat spreader molded in at the topmost surface of the module.

30. The module of claim 4 wherein an electrically nonconductive heat-conducting molding is employed for a module encapsulation.

31. A multiple chip module comprising: a first substrate; a first die mounted onto the first substrate; a wire connected to the first die and the first substrate; a spacer mounted on the first die; and an inverted package stacked on the spacer with a surface of a molding of the inverted package affixed to a surface of the spacer opposite the first die, the inverted package overlying and directly over the wire and having an inverted package substrate in direct contact with a surface of the molding opposite the spacer; and wire bonds attached directly to the first substrate and the inverted package substrate.

32. The module of claim 31 wherein the first substrate includes a BGA substrate.

33. The module of claim 31 comprising a plurality of die mounted on said first substrate.

34. The module of claim 31 wherein said first die is connected to said first substrate by wire bonds, and wherein said spacer is affixed onto an upward facing side of the die, and wherein the inverted package is affixed onto an upward facing side of the spacer.

35. The module of claim 31 wherein the wire bonds are in direct contact with a top side of the first substrate and the inverted package substrate.

36. The module of claim 34 wherein the wire bonds connect z-interconnect wire bond pads on an upward facing side of the inverted package with pads on the first substrate.

37. The module of claim 34 wherein the wire bonds connect z-interconnect wire bond pads on an upward facing side of the inverted package with z-interconnect wire bond pads on an upward-facing side of the first substrate.

38. The module of claim 34 wherein the wire bonds connect z-interconnect wire bond pads on an upward facing side of the inverted package with z-interconnect wire bond pads on the upward-facing side of the first substrate, and further comprising an additional die mounted on the upward facing side of the inverted package.

39. The module of claim 4 wherein the inverted package includes a package die attached to a package substrate by flip chip or wire bond interconnection.

40. The module of claim 4 wherein the inverted package comprises a laminate substrate LGA.

41. The module of claim 4 wherein the inverted package comprises a tape-based LGA.

42. The module of claim 4 wherein the inverted package comprises a QFN package.

43. The module of claim 4 wherein the inverted package comprises a BCC package.

44. The module of claim 4 wherein the inverted package comprises at least one die.

45. The module of claim 44 wherein the inverted package comprises a plurality of die.

46. The module of claim 44 wherein the inverted package comprises a plurality of stacked die.

47. A computer containing a multiple chip module comprising: a first substrate; a first die mounted onto the first substrate with a die attach epoxy, a wire connected to the first die and the first substrate, a spacer affixed onto the first die, and an inverted package stacked upon said spacer with a surface of a molding of the inverted package affixed to a surface of the spacer opposite the first die, the inverted package is overlying and directly over the wire and includes an inverted package substrate in direct contact with a surface of the molding opposite the spacer; and a wire bond attached directly to the first substrate and an upward facing side of the inverted package substrate.

48. A portable electronic apparatus containing a multiple chip module comprising: a first substrate; a first die mounted onto the first substrate with a die attach epoxy, a wire connected to the first die and the first substrate, a spacer affixed onto an active side of the first die, and an inverted package stacked upon the spacer with a surface of a molding of the inverted package affixed to a surface of the spacer opposite the first die, the inverted package is overlying and directly over the wire and has an inverted package substrate in direct contact with a surface of the molding opposite the spacer; and a wire bond attached directly to the first substrate and an upward facing side of the inverted package substrate.

49. A mobile telecommunications device containing a multiple chip module comprising: a first substrate, a first die mounted onto the first substrate with a die attach epoxy, a wire connected to the first die and the first substrate, a spacer affixed onto the first die, and an inverted package stacked upon the spacer with only an adhesive between the inverted package and the spacer and a surface of a molding of the inverted package affixed to a surface of the spacer opposite the first die, the inverted package overlying and directly over the wire and having an inverted package substrate in direct contact with a surface of the molding opposite the spacer; and a wire bond attached directly to the first substrate and an upward facing side of the inverted package substrate.

* * * * *

UNITED STATES PATENT AND TRADEMARK OFFICE
CERTIFICATE OF CORRECTION

PATENT NO. : 8,970,049 B2  
APPLICATION NO. : 11/014257  
DATED : March 3, 2015  
INVENTOR(S) : Karnezos Page 1 of 1

It is certified that error appears in the above-identified patent and that said Letters Patent is hereby corrected as shown below:

In the Specification:

Column 2, line 9, delete "second 24," and insert therefor --second die 24--

Signed and Sealed this
Sixteenth Day of February, 2016

Michelle K. Lee
*Director of the United States Patent and Trademark Office*